US008947082B2

(12) United States Patent
Kubik

(10) Patent No.: US 8,947,082 B2
(45) Date of Patent: Feb. 3, 2015

(54) DUAL-AXIS ANISOTROPIC MAGNETORESISTIVE SENSORS

(75) Inventor: Jan Kubik, Limerick (IE)

(73) Assignee: University College Cork, National University of Ireland, Cork (IE)

( * ) Notice: Subject to any disclaimer, the term of this patent is extended or adjusted under 35 U.S.C. 154(b) by 273 days.

(21) Appl. No.: 13/278,827

(22) Filed: Oct. 21, 2011

(65) Prior Publication Data

US 2013/0099783 A1  Apr. 25, 2013

(51) Int. Cl.
 *G01R 33/02* (2006.01)
 *G01R 33/09* (2006.01)

(52) U.S. Cl.
 CPC .................................. *G01R 33/096* (2013.01)
 USPC .......................................... 324/252; 324/249

(58) Field of Classification Search
 CPC ........ G01R 33/00; G01R 33/02; G01R 33/06; G01R 33/09; G01R 33/096
 USPC ............ 324/252, 247, 166, 174, 165, 207.14, 324/207.13, 207.21, 207.25; 338/32 R; 257/E43.001, E43.004
 See application file for complete search history.

(56) References Cited

U.S. PATENT DOCUMENTS

| | | | |
|---|---|---|---|
| 4,533,872 A | | 8/1985 | Boord et al. |
| 4,847,584 A | | 7/1989 | Pant |
| 4,954,216 A | * | 9/1990 | Hunter et al. .................. 216/22 |
| 5,247,278 A | | 9/1993 | Pant et al. |
| 5,351,005 A | | 9/1994 | Rouse et al. |
| 5,351,028 A | * | 9/1994 | Krahn ......................... 338/32 R |
| 5,521,501 A | | 5/1996 | Dettmann et al. |
| 5,689,185 A | | 11/1997 | Widdershoven et al. |
| 6,011,390 A | | 1/2000 | Loreit et al. |
| 6,529,114 B1 | | 3/2003 | Bohlinger et al. |
| 6,556,007 B1 | * | 4/2003 | Abe et al. ...................... 324/252 |
| 6,633,462 B2 | | 10/2003 | Adelerhof |
| 6,828,781 B1 | | 12/2004 | Butzmann |

(Continued)

FOREIGN PATENT DOCUMENTS

| | | |
|---|---|---|
| DE | 19746199 A1 | 4/1999 |
| JP | 10170619 A | 6/1998 |

(Continued)

OTHER PUBLICATIONS

PCT International Search Report from PCT/US2012/60727 mailed on Dec. 11, 2012.

*Primary Examiner* — Patrick Assouad
*Assistant Examiner* — Hoang X Nguyen
(74) *Attorney, Agent, or Firm* — Kenyon & Kenyon, LLP

(57) ABSTRACT

An integrated dual-axis anisotropic magnetoresistive sensor can include first and second sensor units. A resistor bridge of the first sensor unit can include a plurality of magnetoresistors, each having at least one strip of anisotropic magnetoresistive material with a longitudinal axis substantially parallel to the technological anisotropy axis of the material. A resistor bridge of the second sensor unit can include a plurality of magnetoresistors having a plurality of strips of the anisotropic magnetoresistive material, the plurality of strips including a first subset having longitudinal axes aligned at a first angle to the technological anisotropy axis and a second subset having longitudinal axes aligned at a second angle to the technological anisotropy axis. The second angle can have the same magnitude as the first, but be rotated in an opposite direction from the technological anisotropy axis.

34 Claims, 10 Drawing Sheets

(56) References Cited

U.S. PATENT DOCUMENTS

| | | |
|---|---|---|
| 6,831,456 B2 | 12/2004 | Doescher |
| 7,005,958 B2 * | 2/2006 | Wan .......................... 338/32 R |
| 7,360,302 B2 * | 4/2008 | Sato et al. ................. 29/603.27 |
| 2003/0141957 A1 | 7/2003 | Bohlinger |
| 2003/0151406 A1 * | 8/2003 | Wan et al. .................... 324/252 |
| 2004/0137275 A1 | 7/2004 | Jander et al. |
| 2005/0270020 A1 * | 12/2005 | Peczalski et al. ............ 324/247 |
| 2006/0152332 A1 * | 7/2006 | Bohlinger ................... 338/32 R |
| 2006/0215332 A1 | 9/2006 | Pappas et al. |
| 2007/0035294 A1 | 2/2007 | Peczalski et al. |
| 2007/0247146 A1 | 10/2007 | Stauth et al. |
| 2008/0116885 A1 * | 5/2008 | Van Zon et al. .......... 324/207.21 |
| 2008/0258722 A1 | 10/2008 | Zon et al. |
| 2009/0121819 A1 * | 5/2009 | Haratani et al. .............. 336/221 |

FOREIGN PATENT DOCUMENTS

| | | |
|---|---|---|
| WO | WO 03/021283 A1 | 3/2003 |
| WO | WO 2005/075943 A1 | 8/2005 |
| WO | WO 2006/077508 A1 | 7/2006 |

* cited by examiner

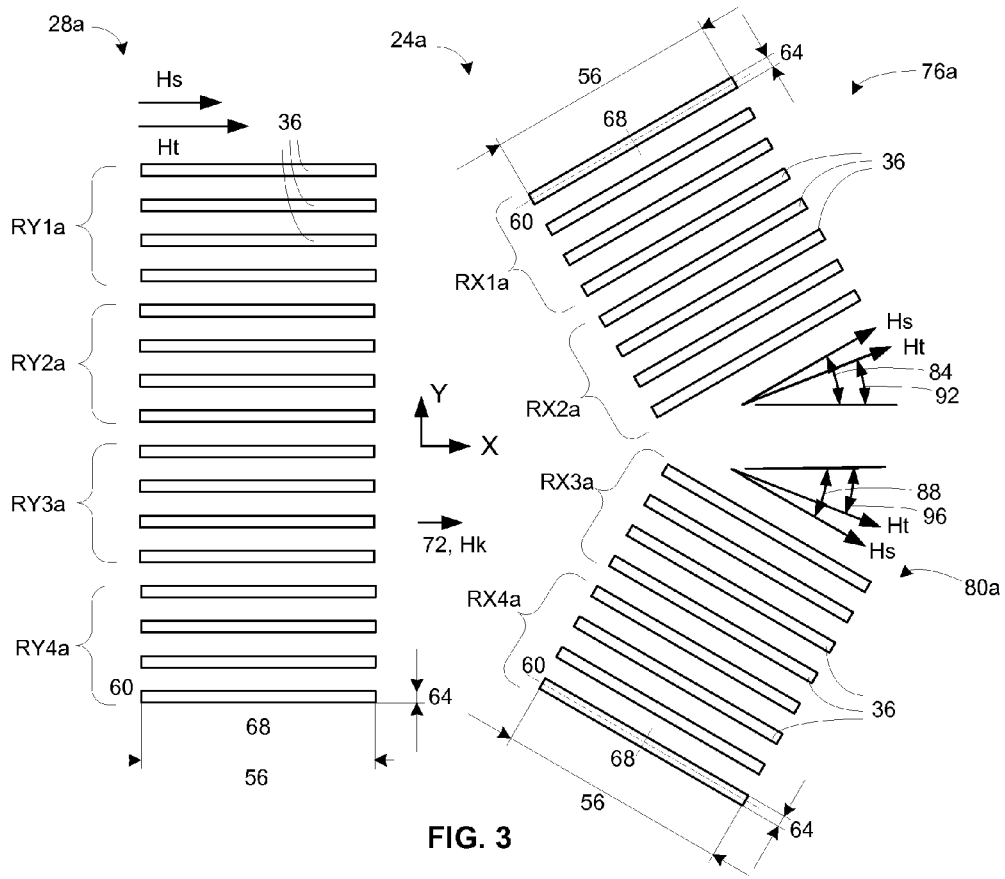
FIG. 3
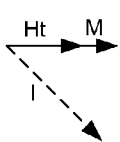 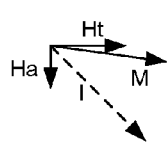 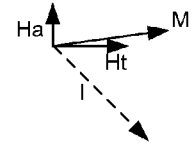
FIG. 5A     FIG. 5B     FIG. 5C
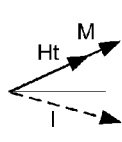 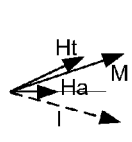 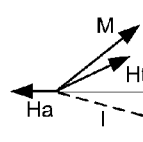 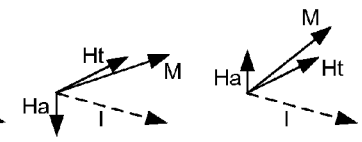
FIG. 6A    FIG. 6B    FIG. 6C    FIG. 6D    FIG. 6E
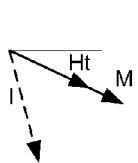 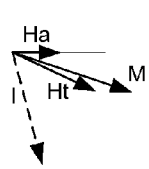 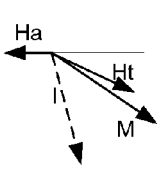 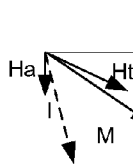 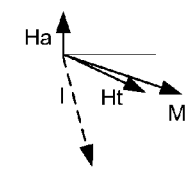
FIG. 7A    FIG. 7B    FIG. 7C    FIG. 7D    FIG. 7E

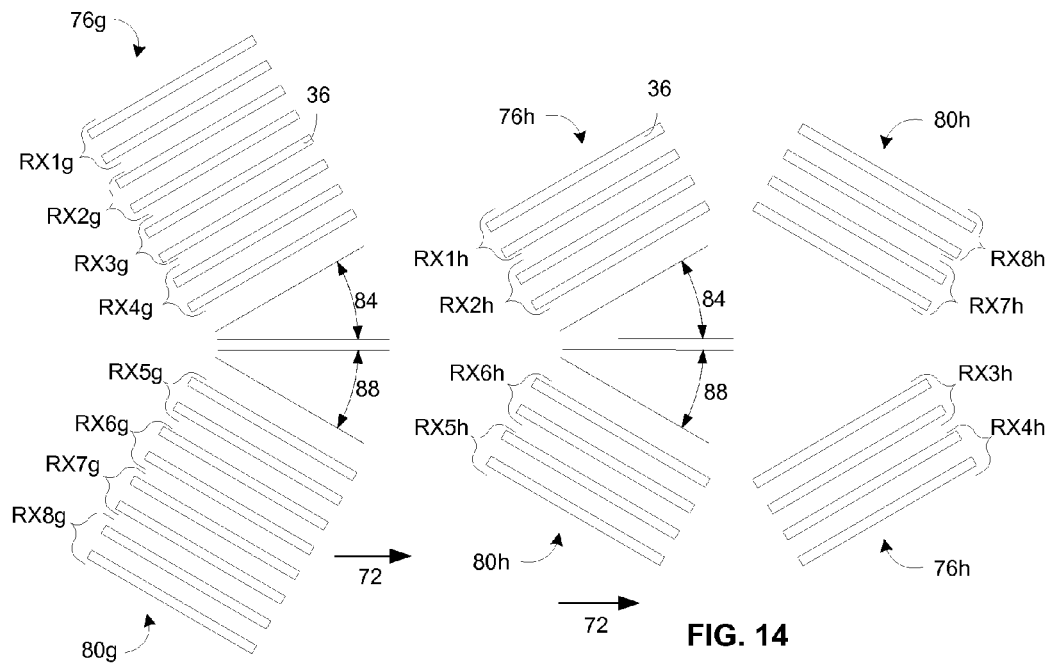
FIG. 13
FIG. 14
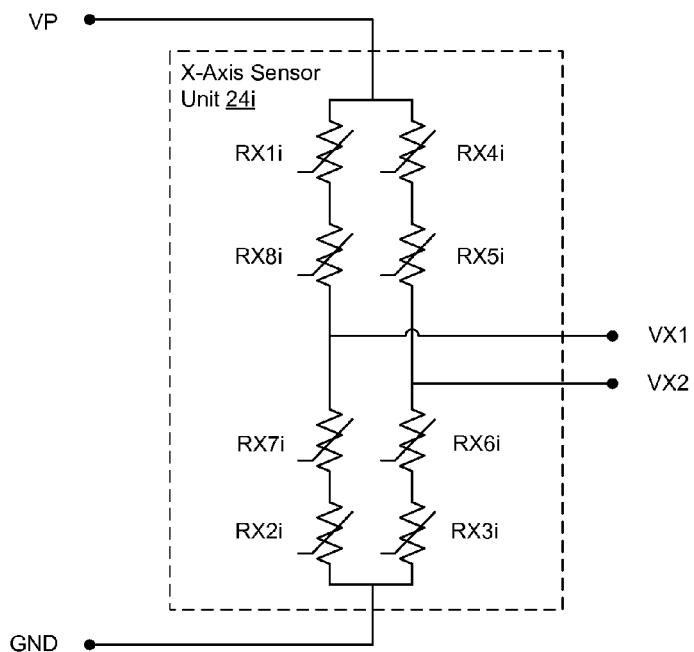
FIG. 15

DUAL-AXIS ANISOTROPIC MAGNETORESISTIVE SENSORS

BACKGROUND INFORMATION

Magnetic-field sensors are used in a variety of applications to sense ambient magnetic fields. Applications for such sensors include automotive control systems, geological- and space-positioning systems, and medical devices, to name just a few. Magnetic-field sensors can use a variety of different principles and mechanisms to sense magnetic fields. One type of magnetic-field sensor is an anisotropic magnetoresistive sensor (AMR sensor). AMR sensors rely on the anisotropic sensitivity of the resistivity of certain magnetic materials to implement electric or electronic circuits, which can then provide outputs representing properties of sensed ambient magnetic fields.

One type of AMR sensor includes a resistor-bridge circuit having resistors composed of such anisotropic magnetic materials. A discrete deposit of anisotropic magnetic material to form a resistor, also known as a magnetoresistor, typically has, as a magnetic property, a total anisotropy represented by a characteristic magnetic field, also known as the total anisotropy field, in a direction parallel to an easy axis of the total anisotropy, also known as the total anisotropy axis. The total anisotropy is a function of a first component, the technological anisotropy, depending on both the crystal structure and processing conditions of the material, and a second component, known as the shape anisotropy, depending on the shape of the deposit that forms the resistor. If the shape of the deposit that forms the resistor is an elongated strip, then the shape anisotropy axis is typically along the longitudinal axis of the strip. If no ambient fields are present, the total anisotropy causes the magnetization of the magnetoresistor to align itself parallel to the total anisotropy axis, in either of two mutually opposite directions along this axis.

A resistor so formed has an electrical resistance to the flow of current through the material dependent upon the angle between the flow of current and the direction of the magnetization existing in the material at a given time. If an ambient field is present, it rotates the angle of magnetization existing in the resistor material, with the greatest rotation, and the greatest change in resistivity of the magnetoresistor, being when the ambient field acts perpendicular to the total anisotropy axis, or along what is known as the sensitivity axis. The amount of magnetization rotation is in this case inversely proportional to the total anisotropy field if the ambient field is much smaller than the total anisotropy field. As the total anisotropy field is a constant, the signal output by the bridge is therefore representative of the sensed ambient field.

A problem with bridge-type AMR sensors occurs when it is desirable to implement a plurality of such sensors using anisotropic magnetoresistive materials of having only a single technological anisotropy axis. Such a scenario can occur, for example, when it is desirable to implement as a single integrated circuit a multi-axis AMR sensor to sense and output signals measuring several different orthogonal vector components of an ambient magnetic field. For various reasons, manufacturing an integrated circuit with anisotropic magnetoresistive materials of multiple technological anisotropy axes is both technologically difficult as well as costly. Therefore, integrated multi-axis AMR sensors are typically constrained, at least practically speaking, to including anisotropic magnetoresistive materials of only a single technological anisotropy axis.

Such a constraint results in significant problems, however, for the design and operation of multi-axis bridge-type AMR sensors. The sensitivity of anisotropic magnetoresistors to ambient magnetic fields depends in part on the technological anisotropy, as it is inversely proportional to the total anisotropy field and the sensitivity axis is perpendicular to total anisotropy axis. While one may override the technological anisotropy axis using a strong shape anisotropy field, resulting in a total anisotropy axis almost parallel to shape anisotropy axis, if the shape anisotropy axis is very different than the technological anisotropy axis, i.e., angled at, e.g., 90° to each other, the magnetization of the whole magnetoresistor is likely to no longer be uniform. Instead, it is possible that many different smaller areas, with various magnetization directions, will form within the magnetoresistor and its sensitivity thereby degraded. Even if this does not happen instantly, it may happen after even a small ambient field is experienced. Such a scenario increases in likelihood with an increasing angle between the technological and shape anisotropy axes. In other words, anisotropic magnetoresistive materials typically do not like to keep their magnetization parallel to the longitudinal axis of the magnetoresistive strip if the strip is perpendicular to technological anisotropy axis.

Therefore, generally speaking, bridge-type AMR sensors have their technological anisotropy axis aligned in some predetermined manner to the vector component of the ambient magnetic field that they measure. However, it is difficult for a single technological anisotropy axis to be aligned in a sensitivity-maximizing manner to more than one different orthogonal vector ambient field component, such as to both x-axis and y-axis ambient field components. Thus, multi-axis bridge-type integrated AMR sensors constrained to a single technological anisotropy axis may not be able to use the same sensor design for each sensor unit sensing a different ambient field vector component. Moreover, if a particular sensor unit of a multi-axis sensor does have its technological anisotropy aligned favorably with the vector component it is to measure, the other sensor units, for sensing other vector components of the magnetic field, may be unfavorably aligned to the technological anisotropy axis, and therefore may suffer performance degradation.

Therefore, there exists a need for multi-axis bridge-type integrated AMR sensors that can be manufactured using anisotropic magnetoresistive materials having only a single technological anisotropy axis, but which still provide good performance for separately sensing multiple orthogonal vector components of an ambient magnetic field.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 3 is a top view integrated-circuit layout depicting an embodiment of the magnetoresistive layer depicted in FIG. 2.

FIGS. 5A-5C are vector diagrams depicting embodiments of the current and magnetic fields in a quiescent state, and in response to y-axis ambient magnetic field components, for a magnetoresistor of the y-axis sensor unit depicted in FIG. 2.

FIGS. 6A-6E are vector diagrams depicting embodiments of the current and magnetic fields in a quiescent state, and in response to y-axis and x-axis ambient magnetic field components, for a magnetoresistor of a first subset of magnetoresistive strips, having a first orientation to the technological anisotropy axis, of the x-axis sensor unit depicted in FIG. 2.

FIGS. 7A-7E are vector diagrams depicting embodiments of the current and magnetic fields in a quiescent state, and in response to y-axis and x-axis ambient magnetic field components, for a magnetoresistor of a second subset of magnetoresistive strips, having a second orientation to the technological anisotropy axis, of the x-axis sensor unit depicted in FIG. 2.

FIG. 13 is a top-view integrated-circuit layout diagram depicting another embodiment of a magnetoresistive layer for embodiments of the x-axis sensor unit.

FIG. 14 is a top-view integrated-circuit layout diagram depicting another embodiment of a magnetoresistive layer for embodiments of the x-axis sensor unit.

FIG. 15 is a circuit schematic depicting an embodiment of an eight-resistor circuit bridge corresponding to the magnetoresistive layers depicted in FIGS. 13 and 14.

DETAILED DESCRIPTION

A dual-axis AMR sensor can include an x-axis sensor unit and a y-axis sensor unit. The sensor can be formed as a single integrated circuit having only a single layer, or vertically continuous set of layers, of anisotropic magnetoresistive material exhibiting only a single technological anisotropy axis. The x-axis and y-axis sensor units can have a primary sensitivity to, and produce an output signal as a function of, x-axis and y-axis ambient magnetic field components, respectively. By contrast, the x-axis and y-axis sensor units can have a reduced or substantially zero sensitivity to, and produce a reduced or substantially zero output signal as a function of, y-axis and x-axis ambient magnetic field components, respectively.

The x-axis and y-axis sensor units of the dual-axis AMR sensor each can include a resistor bridge formed by a plurality of magnetoresistors, each magnetoresistor composed of one or more strips of the magnetoresistive material connected in series by conductive interconnect. The y-axis sensor unit can include magnetoresistive strips having longitudinal axes aligned in parallel with the technological anisotropy axis of the magnetoresistive material. The x-axis sensor, by contrast, can include two subsets of magnetoresistive strips. A first subset of the magnetoresistive strips can have longitudinal axes aligned at a first angle, such as less than 45°, to the technological anisotropy axis. A second subset of the magnetoresistive strips can have a longitudinal axis aligned at a second angle to the technological anisotropy axis, the second angle having the same magnitude, but rotated in the opposite direction from the technological anisotropy axis, as the first angle.

The alignment of both the first and second subsets of magnetoresistive strips of the x-axis sensor unit at angles to both the x-axis and the y-axis can cause both subsets to have sensitivity to both x-axis and y-axis ambient field components. However, the equal but oppositely angled orientations of the first and second subsets of magnetoresistive strips, and their configuration into the resistor bridge of the x-axis sensor unit, can result in a sensitivity of the magnetoresistors to y-axis ambient fields cancelling and a sensitivity to x-axis ambient fields adding together in the x-axis sensor unit. The first and second subsets of magnetoresistive strips and corresponding magnetoresistors can thus yield a primary sensitivity of the x-axis sensor unit to x-axis ambient field components and a reduced or substantially zero sensitivity of the x-axis sensor unit to y-axis ambient field components.

Figure 1:
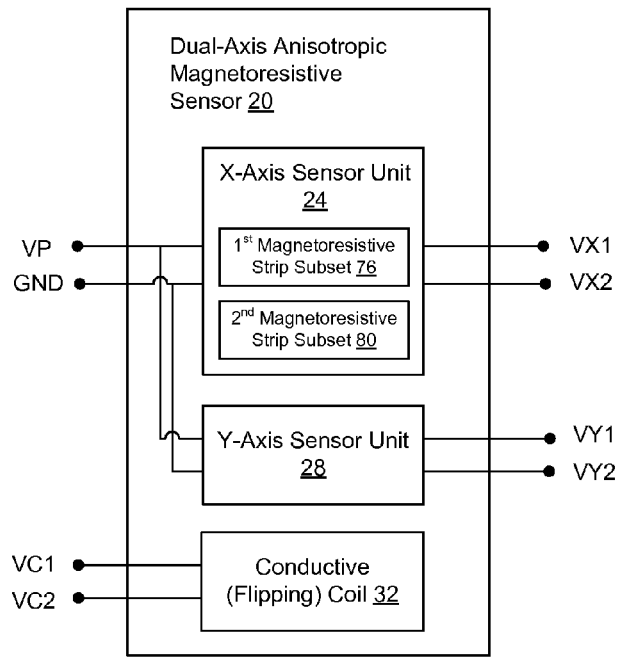
FIG. 1 is a circuit schematic depicting an embodiment of a dual-axis integrated AMR sensor.

FIG. 1 is a simplified block-diagram circuit schematic depicting an embodiment of the dual-axis integrated AMR sensor 20. The AMR sensor 20 can include two orthogonal sensor units 24, 28 and a conductive flipping coil 32. A first sensor unit 24 can be an x-axis sensor 24 receiving power supply and ground inputs VP, GND and providing a differential output signal VX1, VX2 (e.g., combinable as VX1–VX2) representing a measurement of a property, such as the magnitude or intensity, of an x-axis vector component of the ambient magnetic field to which the AMR sensor 20 is exposed. A second sensor unit 28 can be a y-axis sensor 28 receiving the power supply and ground inputs VP, GND and providing a differential output signal VY1, VY2 (e.g., combinable as VY1–VY2) representing a measurement of a property, such as the magnitude or intensity, of a y-axis vector component of the ambient magnetic field to which the AMR sensor 20 is exposed. The two sensor units 24, 28 thus each can sense and provide outputs primarily in response to only mutually orthogonal vector components of the ambient magnetic field. The conductive flipping coil can receive the power supply and ground inputs VP, GND and operate to provide magnetic fields to the x-axis and y-axis sensor units 24, 28 to selectively set the initial vector direction of the magnetization of magnetoresistive strips thereof in one of two orientations parallel to the total anisotropy axes of the strips, depending on the polarity of the coil power supply.

Spatial vectors comprise up to three orthogonal components, and for purposes of simplicity of discussion and illustration herein, when referring to the two orthogonal components of the ambient magnetic field that the dual-axis AMR sensor 20 senses, we refer to x-axis and y-axis components. However, this labeling is arbitrary, and the two sensed orthogonal components could instead be any two of the x-, y-, and z-axis orthogonal components of the ambient field. Also, for purposes of discussion herein, the ambient magnetic field is considered to be the magnetic field existing in the space in which the AMR sensor 20 is located, and is produced by sources other than the AMR sensor 20 or its components.

Figure 2:
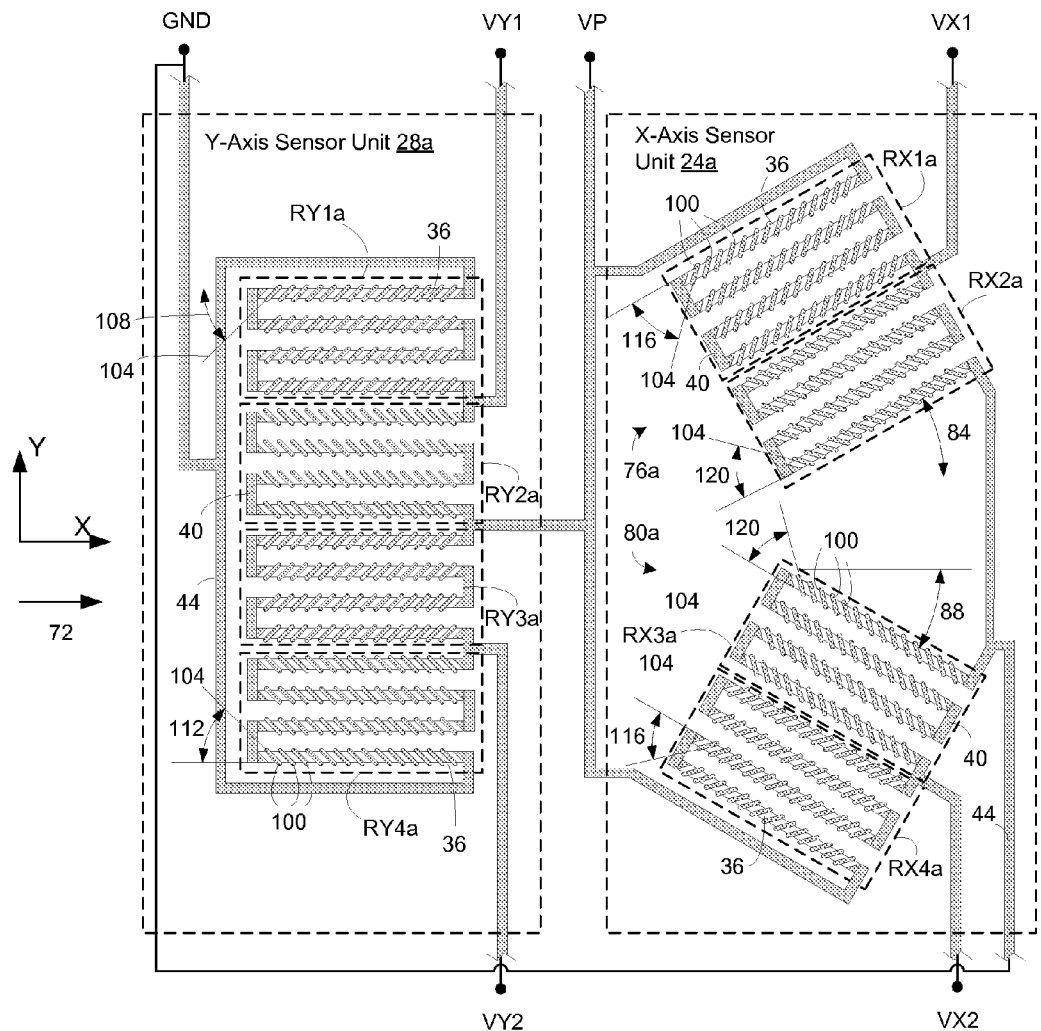
FIG. 2 is partially a top-view layout diagram and partially a circuit-schematic diagram, depicting embodiments of x-axis and y-axis sensor units of the dual-axis integrated AMR sensor.

FIG. 2 depicts embodiments of the x-axis and y-axis sensor units 24a, 28a of the dual-axis AMR sensor 20. FIG. 2 includes a top view of the layout of magnetoresistive and conductive layers of the integrated circuit containing the sensor units 24a, 28a, as well as schematic representation of some electrical connections not explicitly shown in the layout for convenience of illustration. The x-axis and y-axis sensor units 24, 28 can both include a plurality of magnetoresistors electrically connected into a bridge circuit configuration such as a four-resistor full-bridge configuration. Each magnetoresistor of the y- and x-sensor-unit bridges can include one or more strips of anisotropic magnetoresistive material connected in series by conductive interconnect. In FIG. 2, the y-axis sensor unit 28a can specifically include first, second, third and fourth magnetoresistors RY1a, RY2a, RY3a, RY4a, each magnetoresistor having four strips 36 of anisotropic magnetoresistive material connected in series by conductive-layer interconnections 40. The y-axis sensor unit 28a can also include conductive interconnect portions 44 connecting these resistors into a circuit bridge, delivering power and ground inputs VP, GND to the y-axis bridge, and delivering differential output signals VY1, VY2 from the y-axis bridge. The x-axis sensor unit 24a can include first, second, third and fourth magnetoresistors RX1a, RX2a, RX3a, RX4a, each having four strips 36 of anisotropic magnetoresistive material connected in series by conductive interconnect 40. The x-axis sensor unit 24a can also include conductive interconnect portions 44 connecting these magnetoresistors into a circuit bridge, delivering power and ground inputs VP, GND to the x-axis bridge, and delivering differential output signals VY1, VY2 from the x-axis bridge. The conductive layer forming the conductive interconnects 40, 44 can include more or more layers of metal, polysilicon or both, and may be located in a layer above, below or at the same height as the magnetoresistive material.

The magnetoresistive strips 36 of the magnetoresistors of the x- and y-axis sensor units 24, 28 can take a variety of geometric forms. FIG. 3 is a top view of just the layer of magnetoresistive material of the x- and y-axis sensor units 24a, 28a depicted in FIG. 2. The strips 36 of anisotropic magnetoresistive material can be substantially rectangular or substantially elongated strips from a top view, having a length 56 along a corresponding longitudinal axis 60 and a width 64 along a transverse axis 68 perpendicular to the longitudinal axis 60, the length 56 being greater in magnitude than the width 64. The magnetoresistive strips 36 may include one or more of square, rounded corner, or pointed ends. Although not necessarily shown in a top view, the strips 36 also have a thickness when viewed from a side view. The thickness of the strips 36 can be smaller, or even much smaller, than the width of the strips 36. For example, in one embodiment, the thickness of the strips 36 can be at least about one thousand times smaller than their width.

The dual-axis integrated AMR sensor 20, and thus the x-axis and y-axis sensor units 24, 28, can be formed using only a single layer, or single vertically continuous set of layers (when viewed from a side view), of magnetoresistive material having only a single technological anisotropy axis. Fabricating the dual-axis AMR sensor 20 to have magnetoresistive material with only a single technological anisotropy axis greatly simplifies and reduces its manufacturing cost. Alternatively, in some embodiments, if other anisotropic magnetoresistive materials having other technological axes are present on the integrated circuit containing the dual axis AMR sensor 20, the anisotropic magnetoresistive material utilized in the dual axis AMR sensor 20 can be a single common layer, or a single common vertically continuous set of layers, having a single common technological anisotropy axis. The anisotropic magnetoresistive material can be a material such as nickel-iron (NiFe) or other anisotropic magnetoresistive material. In FIGS. 2 and 3, the technicalogical anisotropy axis 72 is shown as being in the horizontal direction, which also is the designated as the x-axis direction in these and other figures.

The x-axis and y-axis sensor units 24, 28 can include magnetoresistive strips 36 having selected orientations of their longitudinal axes 60 to the technological anisotropy axis 72. The y-axis sensor unit 28 can include magnetoresistive strips 36 having longitudinal axes 60 aligned only in parallel with the technological anisotropy axis 72. The x-axis sensor unit 24 can include two subsets of magnetoresistive strips 76, 80. A first subset 76 including only strips 36 having longitudinal axes 60 aligned at a positive predetermined angle 84 to the technological anisotropy axis 72, and a second subset 80 including only strips 36 having longitudinal axes 60 aligned at another predetermined angle 88 to the technological anisotropy axis 72, where this predetermined angle 88 has the same magnitude as the predetermined angle 84 of the first subset 76, but is rotated away from the technological anisotropy axis 72 in the opposite direction, i.e., in the opposite polarity from the technological anisotropy axis 72 than the first subset predetermined angle 84. FIGS. 2 and 3 depict an exemplary embodiment 76a, 80a of the first and second subsets of magnetoresistive strips 76, 80. The angles of rotation 84, 88 of the longitudinal axes 60 of the first and second subsets of magnetoresistive strips 76, 80 to the technological anisotropy axis 72 can vary. In one embodiment, these angles 84, 88 can be selected from a range of angles between about ±30° to about ±40°, and the longitudinal axes 60 of the first and second subsets of magnetoresistive strips 76, 80, respectively, will not be perpendicular to each other. In another embodiment, these angles 84, 88 can be selected from a range of angles between about ±20° to about ±60°.

Each individual discrete magnetoresistive strip 36 can have associated inherent magnetic properties, including the total anisotropy, represented by the total anisotropy field Ht in a direction parallel to the total anisotropy axis. The total anisotropy axis and associated total anisotropy field Ht of a magnetoresistive strip 36 can be a function of the technological anisotropy axis and associated characteristic technological anisotropy field Hk of the magnetoresistive material layer and a shape anisotropy axis and associated characteristic shape anisotropy field Hs of the strip 36 itself. For an elongated rectangular strip 36, the shape anisotropy field Hs can be roughly parallel to the longitudinal axis 60 of the strip 36. In FIGS. 2 and 3, for each of the magnetoresistive strips 36 of the bridge magnetoresistors of the y-axis sensor unit 28a, the total anisotropy field Ht can be parallel to the x-axis direction, as is the technological anisotropy field Hk and the shape anisotropy field Hs. For each of the magnetoresistive strips 36 of the first subset of strips 76 of the x-axis sensor unit 24a, the total anisotropy field Ht can be angled to the x-axis direction at a predetermined angle 92 that can be a function of the technological anisotropy field Hk, which is parallel to the x-axis direction, and the shape anisotropy Hs of the corresponding strips 36, which can be in a direction parallel to the longitudinal axes 60 of the strips 36 at the first predetermined angle 84 from the x-axis. The total anisotropy field Ht for these strips can thus be represented as angled to the x-axis direction at a predetermined angle 92 that is a little less than the predetermined angle 84 of the longitudinal axes 60 of these strips from the x-axis. For each of the magnetoresistive strips 36 of the second subset of strips 80 of the x-axis sensor unit 24a, a similar outcome can result, with the total anisotropy field Ht for these strips 36 represented as angled to the x-axis at a predetermined angle 96 that is a little less than the predetermined angle 88 of the longitudinal axes 60 of these strips 36 from the x-axis.

The conductive interconnect layer of the x-axis and y-axis sensor units 24, 28 can also include a plurality of discrete strips 100 of conductive material formed on top of or below each of the magnetoresistive strips 36. These conductive strips 100 are also known as "barber pole" strips 100 due to their resemblance to barber poles often seen outside of barber shops. The conductive strips 100 can each have an elongated rectangular, substantially rectangular, or rounded-edge rectangular shape, and have a corresponding longitudinal axis 104 along its length. The barber pole strips 100 can alter the directionality of current flowing through the corresponding magnetoresistive strips 36 on which they are formed, and thereby alter the directional sensitivity and operational linearity, in response to ambient magnetic fields, of the magnetoresistors formed by these strips 36. Briefly, electric current tends to flow through the barber pole strips 100 instead of underlying portions of the magnetoresistive strips 36, and when current flows through portions of the magnetoresistive strips 36 between the barber pole strips 100, it tends to flow in a direction perpendicular to the longitudinal axes 104 of the barber pole strips. Generally speaking, magnetoresistive material displays its greatest electrical resistance when the current flowing therethrough flows parallel to the magnetization in the material, and the least electrical resistance when current flows perpendicular to the magnetization. The use of barber pole strips 100 can thus control the direction of current flow through the corresponding magnetoresistive strips 36, to provide a bi-directional response and improved linearity of their electrical resistance variation to ambient magnetic fields.

The x-axis and y-axis sensor units 24, 28 can each include barber pole strips 100 having longitudinal axes 104 oriented in more than one direction relative to the longitudinal axes 60 of the corresponding magnetoresistive strips 36. The y-axis sensor unit 28 can include barber pole strips 100 having longitudinal axes 104 oriented in two different directions relative to the longitudinal axes 60 of the corresponding magnetoresistive strips 36. A first set of magnetoresistors can have barber pole strips 100 oriented at a first angle 108 to the longitudinal axes 60 of the corresponding magnetoresistive strips 36, and a second set of magnetoresistors can have barber pole strips 100 oriented at a second angle 112 to the longitudinal axes 60 of the corresponding magnetoresistive strips 36. In FIG. 2, the first set of magnetoresistors can include the first and third resistors RY1a, RY3a, and the second set of magnetoresistors can include the second and fourth resistors RY2a, RY4a. The x-axis sensor unit 24 can also include barber pole strips 100 having longitudinal axes 104 oriented in two different directions relative to the longitudinal axes 60 of the corresponding magnetoresistive strips 36. In embodiments, a first set of magnetoresistors can have barber pole strips 100 oriented at a first angle 116 to the longitudinal axes 60 of the corresponding magnetoresistive strips 36 and a second set of magnetoresistors can have barber pole strips 100 oriented at a second angle 120 to the longitudinal axes 60 of the corresponding magnetoresistive strips 36. In FIG. 2, the first set of magnetoresistors can include the first and fourth magnetoresistors RX1a, RX4a, and the second set of magnetoresistors can include the second and third magnetoresistors RX2a, RX3a.

The angles of orientation of the longitudinal axes 104 of the barber pole strips 100 to the longitudinal axes 60 of the corresponding magnetoresistive strips 36 can vary, and in exemplary embodiments can be selected from a range of angles between about ±35° to about ±55°.

The differing orientation of the barber pole strips 100 for magnetoresistors within the x-axis and y-axis sensor units 24, 28 can be configured to correspond with the corresponding magnetoresistors position and operation within the resistor bridges of these sensor units 24, 28. In brief, the two different directions of the longitudinal axes 104 of the barber pole strips 100 can enable opposite resistance variation polarities of the corresponding magnetoresistors in response to ambient magnetic fields, which can be utilized within the resistor bridge circuits to provide differential output signals. To enable this opposite resistance-variation polarity, the two different directions of the longitudinal axis 104 within the y-axis sensor unit 28 or within the subsets of magnetoresistive strips 76, 80 of the x-axis sensor unit 28 can be oriented at a predetermined angle to each other, such as at an angle equal to the sum of two opposite but equal angles of these longitudinal axes 104 to the respective strip longitudinal axes 60. For example, in one embodiment, the two different orientations of the longitudinal axes 104 can be at +45° and −45° to the longitudinal axes 60 of their respective magnetoresistive strips 36, and thus be angled at 90° to each other. In other examples, the two different orientations of the longitudinal axes 104 can be at some positive angle and some equal but opposite negative angle, e.g., at +40° and −40°, +35° and −35°, or +30° and −30°, etc., to the longitudinal axes 60 of their respective magnetoresistive strips 36, and thus angled at, e.g., 80°, 70°, or 60°, etc., to each other.

Figure 4:
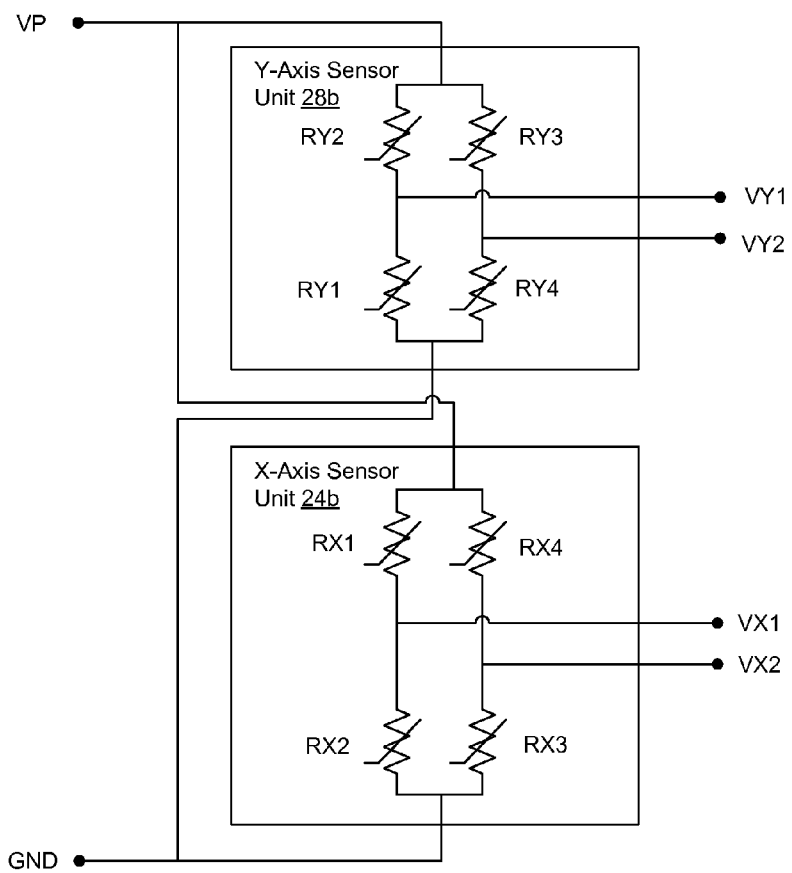
FIG. 4 is a circuit schematic depicting embodiments of resistor-bridge equivalent circuits corresponding to the x-axis and y-axis sensor units depicted in FIG. 2.

Each of the x-axis and y-axis sensor units 24, 28 can form a resistor bridge circuit that can receive power and ground inputs VP, GND and provide differential output signals VX1, VX2, VY1, VY2, representing the sensed ambient magnetic field x- and y-axis components, respectively. FIG. 4 is a schematic circuit diagram depicting equivalent circuit embodiments 24b, 28b of the x-axis and y-axis sensor units 24, 28. Each of the x-axis and y-axis sensor units 24, 28 can include a four-resistor full-bridge circuit, with a top bridge node receiving the power supply voltage VP, a bottom bridge node receiving a ground voltage GND, and middle bride nodes delivering first and second output voltages VX1, VX2, VY1, VY2 that together form the differential output voltages. For the y-axis sensor unit 28, the second and third magnetoresistors RY2a, RY3a (or as otherwise labeled in other embodiments) can be represented by corresponding circuit resistors RY2, RY3 connected between the power supply VP and the output nodes VY1, VY2, and the first and fourth magnetoresistors RY1a, RY4a (or as otherwise labeled in other embodiments) can be represented by corresponding first and fourth circuit resistors RY1, RY4 connected between the output VY1, VY2 and ground nodes GND. For the x-axis sensor unit 24, the first and fourth magnetoresistors RX1a, RX4a (or as otherwise labeled in other embodiments) can be represented by first and fourth circuit resistors RX1, RX4 connected between the power supply VP and output nodes VX1, VX2, and the second and third magnetoresistors RX2*a*, RX3*a* (or as otherwise labeled in other embodiments) can be represented by second and third circuit resistors RX2, RX3 connected between the output VX1, VX2 and ground nodes GND. Note, however, that the labeling and reference to herein of resistors as "first," "second," "third," or "fourth" is arbitrary, and purely for convenience of discussion herein, and different numbers or other reference designators could instead be given to these magnetoresistors or their circuit resistor equivalents.

When no ambient magnetic fields are present, each of the bridge magnetoresistors can have a nominal equivalent resistance. A voltage drop equal to the difference between the power supply voltage VP and ground GND can thus exist across the resistor bridge, from top to bottom, with an equal voltage drop forming across each of the resistors. The individual output voltages can thus be equal, and the different output voltages be substantially zero. The substantially zero differential output voltages can be used to indicate that no x- or y-axis ambient field components are sensed.

When an ambient magnetic field is present, the magnetoresistive properties of the magnetoresistors can cause the nominal resistance of the magnetoresistors to change in response to the magnitude and directionality of the ambient magnetic field. The position of the magnetoresistors in the resistor bridge circuits, the alignment of the barber pole longitudinal axes 104 to the corresponding magnetoresistor longitudinal axes 60, and the direction and magnitude of the magnetoresistor total anisotropies in the x-axis and y-axis sensor units 24, 28 can provide a primary sensitivity of these sensor units 24, 28 to the x-axis and y-axis ambient field components, respectively, and determine the correspondence of the polarity of the differential output signals VX1, VX2, VY1, VY2 to the polarity of the ambient field components. For example, the y-axis sensor unit 28 can output a positive differential output signal VY1, VY2 in response to an ambient magnetic field component in a positive y-axis direction, output a negative differential output signal VY1, VY2 in response to an ambient magnetic field component in a negative y-axis direction, and output a reduced or substantially zero differential output signal VY1, VY2 in response to an ambient magnetic field component in either a positive or a negative x-axis direction. Similarly, the x-axis sensor unit 24 can output a positive differential output signal VX1, VX2 in response to an ambient magnetic field component in a positive x-axis direction, output a negative differential output signal VX1, VX2 in response to an ambient magnetic field component in a negative x-axis direction, and output a reduced or substantially zero differential output signal VX1, VX2 in response to an ambient magnetic field component in either a positive or a negative y-axis direction.

The x-axis and y-axis sensor units 24, 28 can provide primary sensitivity to x-axis and y-axis magnetic field components, respectively, through different approaches. First, we can consider the operation of the y-axis sensor unit 28. The y-axis sensor unit 28 can provide primary sensitivity to y-axis ambient field components by having the total anisotropy field Ht of its magnetoresistive strips 36 aligned along the x-axis and its barber pole longitudinal axes 104 aligned at an angle to both the x-axis and y-axis, e.g., at 45°. In a quiescent state, the magnetization direction can be held parallel to the total anisotropy axis by the total anisotropy field Ht in the x-axis direction. Y-axis ambient field components can change the magnetization direction relative to the current direction, and thus impact magnetoresistivity and provide an output signal VY1, VY2, because they rotate the magnetization from the x-axis direction, where it had been held in the quiescent state by the total anisotropy field Ht, towards the y-axis ambient field vector direction. This also prevents x-axis ambient field components from having any effect on the magnetization direction, magnetoresistivity and or the output signal VY1, VY2, because they merely strengthen an x-axis only total anisotropy field Ht already holding the magnetization direction parallel to the x-axis.

To illustrate, FIGS. 5A-5C depict exemplary current and magnetic field vectors for an exemplary magnetoresistive strip 36 of the y-axis sensor unit 28 having the barber poles 100 oriented at 45° to the x-axis. In FIG. 5A, in the quiescent state (i.e., with no ambient magnetic fields present), the direction of current flow I resulting from the alignment of the barber poles 100 to the x-axis is also at 45° to the x-axis, although perpendicular to the barber pole longitudinal axis 104, and the magnetization M in the magnetoresistive strips 36 can be shown as having the same direction as the total anisotropy Ht of the strip, which is in the x-axis direction. Because electrical resistance of a magnetoresistor can vary from its greatest value when current flows parallel to the magnetization present in the material to its lowest value when current flows perpendicular to the magnetization, the quiescent state in FIG. 5A can represent the resistivity of the magnetoresistor being at an intermediate value. In FIG. 5B, if an ambient magnetic field Ha exists in the negative y-axis direction, the magnetization M in the magnetoresistive strip 36 can move in a vector direction closer to the current direction I, therefore increasing the resistance. In FIG. 5C, if an ambient magnetic field Ha exists in the positive y-axis direction, the magnetization M in the magnetoresistive strip 36 can be moved in a vector direction further from the current direction I, therefore decreasing the resistance.

A similar vector model can represent the other magnetoresistors of the y-axis sensor unit 28, with a polarity variation between the magnetoresistors of different barber pole orientations, which, when coupled in the resistor bridge circuit configuration, can yield the differential output signal VY1, VY2 having polarities corresponding to the magnetic field component polarities as discussed above. Note that, for the y-axis sensor 28, ambient field components in the x-axis direction will only result in magnetization vector directions that are still in the x-axis direction, and at the same vector angle to the current direction. Thus, the y-axis sensor 28 can be relatively insensitive to ambient field components in the x-axis direction.

Next, we consider the operation of the x-axis sensor unit 24. The x-axis sensor unit 24 can provide primary sensitivity to x-axis ambient field components by having both the total anisotropy Ht of its magnetoresistive strips 36 and the longitudinal axes 60 of its barber poles 100 aligned at two different angles to both the x-axis and y-axis. This can result in both x-axis and y-axis ambient field components changing the magnetization vector direction relative to the current direction, and thus impact magnetoresistivity. However, the different angles can be selected and configured within the resistor bridge circuits to accumulate the effect of the x-axis ambient field component, but cancel the effect of the y-axis ambient field component, thereby providing a non-zero output signal VX1, VX2 in response to x-axis ambient field components but a substantially reduced or zero output signal VX1, VX2 in response any y-axis ambient field components.

FIGS. 6A-6E depict exemplary current and magnetic field vectors for an exemplary magnetoresistive strip of the x-axis sensor unit 24 oriented at 30° to the x-axis and having barber poles 100 oriented at 45° to the longitudinal axis 60 of the magnetoresistive strip 36. In FIG. 6A, in the quiescent state (i.e., with no ambient magnetic field present), the direction of current flow I resulting from the alignment of the barber poles 100 can be at about −15° to the x-axis, and the magnetization M in the magnetoresistive strips 36 can be aligned to the total anisotropy Ht of the strip 36 at about 25° to the x-axis (i.e., at an angle a little less than the shape anisotropy angle of 30°). The quiescent state in FIG. 6A can represent the resistivity again being at an intermediate value it is sensitivity range, although somewhat closer toward the higher end of the resistivity range than in the quiescent state of the y-axis sensor unit 28. In FIG. 6B, if an ambient magnetic field Ha exists in the positive x-axis direction, the magnetization M in the magnetoresistive strip can move in a vector direction closer to the current direction, therefore increasing the resistance. In FIG. 6C, if an ambient magnetic field Ha exists in the negative x-axis direction, the magnetization M in the magnetoresistive strip 36 can move in a vector direction further from the current direction I, therefore decreasing the resistance.

This operation can exist in the other magnetoresistors of the x-axis sensor unit 24, with a polarity variation between the magnetoresistors of different barber pole orientations, as a well as, for y-axis ambient field components, another polarity variation due to the two different orientations of the first and second subsets of magnetoresistive strips 76, 80 to the x-axis, which, when coupled with the resistor bridge circuit configuration, can yield the differential output signal VX1, VX2 having polarities corresponding to the magnetic field component polarities as discussed above.

Note that, unlike for x-axis ambient fields in the y-axis sensor unit 28, in the x-axis sensor unit 24, ambient field components in the y-axis direction will result in magnetization directions that move closer to or further away from the current direction, and thus, an individual magnetoresistive strip or magnetoresistor of the x-axis sensor unit 24 can also be sensitive to ambient field components in the y-axis direction. In FIG. 6D, if an ambient magnetic field Ha exists in the negative y-axis direction, the magnetization M in the magnetoresistive strip 36 can move in a vector direction closer to the current direction I, therefore increasing the resistance. In FIG. 6E, if an ambient magnetic field Ha exists in the positive y-axis direction, the magnetization M can move in a vector direction further from the current direction I, therefore decreasing the resistance.

However, the presence of both the first and second subsets of magnetoresistive strips 76, 80, having different orientations of their longitudinal axes 60 to the technological anisotropy axis 72, along with the connection of the magnetoresistors in the resistor bridge, effectively cancels out the effect of y-axis ambient field components on the output VX1, VX2 of the x-axis sensor unit 24. This can provide an x-axis sensor unit 24 that can be relatively insensitive to ambient field components in the y-axis direction. That is, if a magnetoresistor of the first subset of magnetoresistive strips 76 having the first orientation to the technological anisotropy axis 72, e.g., the first magnetoresistor RX1a, can be represented by the vector model of FIGS. 6A-6E, the second subset of magnetoresistive strips 80 having the second orientation to the technological anisotropy axis 72, e.g., the third magnetoresistor RX3a, can be represented by an exemplary vector model depicted in of FIGS. 7A-7E. In FIG. 7A, in the quiescent state, the predominant current direction I can instead be in a direction rotated by an angle roughly equal to the sum of the angles 84, 88 of the longitudinal axes 60 of the first and second subsets of strips 76, 80 to the technological anisotropy axis 72, e.g., by about 60°, from the current direction I of the first subset of strips 76 depicted in FIGS. 6A-6E. In FIGS. 7B-7C, ambient magnetic fields Ha in the positive and negative x-axis directions, respectively, can produce the opposite changes on the magnetization M, and thus in magnetoresistivity, as for the magnetoresistive strips of the first subset 76, as depicted in FIGS. 6B-6C. In FIGS. 7D-7E, however, ambient magnetic fields Ha in the negative and positive y-axis directions, respectively, can produce the same changes on the magnetization M, and thus magnetoresistivity, as for the magnetoresistive strips of the first subset 76 as depicted in FIGS. 6D-6E.

When incorporated into the resistor bridge of the x-axis sensor unit 24 as depicted in FIG. 4, the effects of the y-axis ambient magnetic field components on the first and second subsets of magnetoresistive strips 76, 80 and corresponding magnetoresistors can add to each other to produce a non-zero output signal VX1, VX2 in response to the x-axis ambient field component, but subtract from each other, and thus substantially cancel, to produce a reduced or substantially zero output signal VX1, VX2 in response to y-axis ambient field components.

Although FIG. 2 depicts an exemplary embodiment of a spatial relationship between the magnetoresistive strips 36 of the y-axis sensor unit 28 and the first and second subsets 76, 80 of the x-axis sensor unit 24, other embodiments may have different spatial relationships between these magnetoresistive strips 36 and yet still achieve the above-described relationships between the longitudinal axes 60 of the magnetoresistive strips 36 and the technological anisotropy axis 72. That is, other embodiments may have different spatial relationships between the magnetoresistive strips 36 of the y-axis sensor unit 28 and the first and second subsets 76, 80 of the x-axis sensor unit 24 than that depicted in FIG. 2, and yet still have the y-axis sensor unit 28 include magnetoresistive strips 36 having longitudinal axes 60 aligned only in parallel with the technological anisotropy axis 72, the first subset 76 of the x-axis sensor unit 76 include only strips 36 having longitudinal axes 60 aligned at the positive predetermined angle 84 to the technological anisotropy axis 72, and the second subset 80 include only strips 36 having longitudinal axes 60 aligned at the second predetermined angle 88 to the technological anisotropy axis 72, where the second angle 88 has the same magnitude but opposite polarity as the first angle 84. For example, the first and second subsets 76, 80 can be aligned to the left or right of each other from a top view perspective, rather than aligned vertically to each other as in the top view perspective of FIG. 2. Additionally, the first and second subsets 76, 80 can be horizontally or vertically spatially aligned, from a top view perspective, or any combination thereof, with the magnetoresistive strips 36 of the y-axis sensor unit 28.

Figure 8:
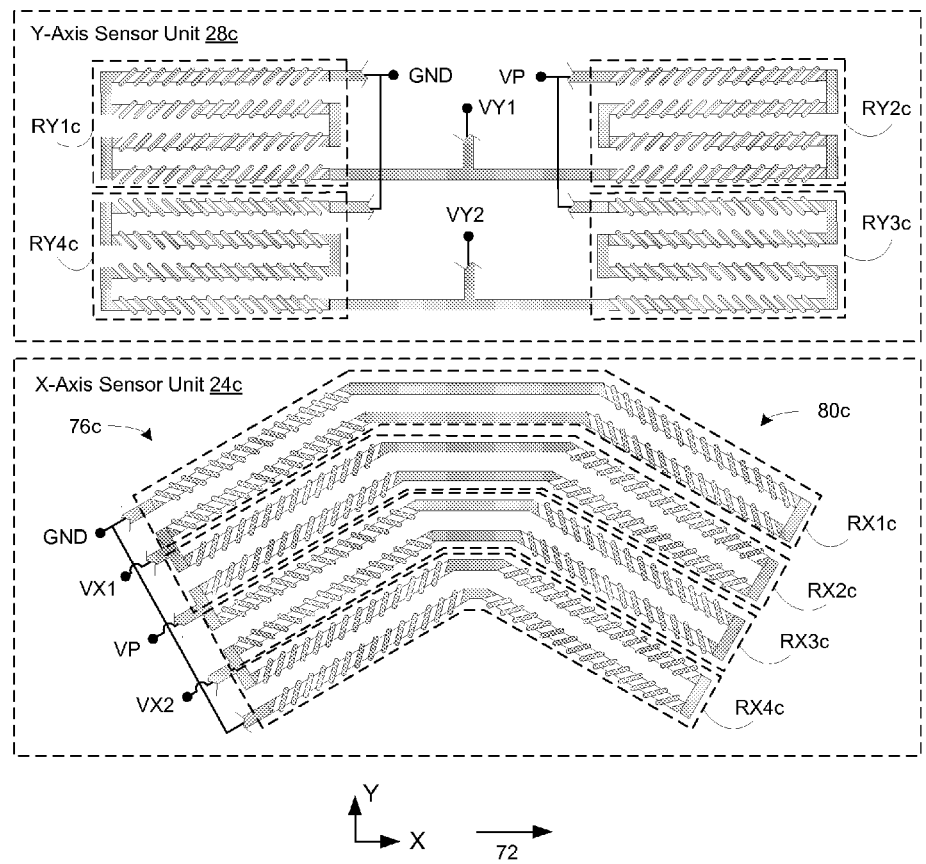
FIG. 8 is partially a top-view integrated-circuit layout diagram and partially a circuit-schematic diagram, depicting another embodiment of the x-axis and y-axis sensor units of the dual-axis AMR sensor.

The primary sensitivity of the x-axis sensor unit 24 can also be achieved by including magnetoresistive strips 36 from each of the two subsets of magnetoresistive strips 76, 80, having the different longitudinal axis orientations to the technological anisotropy axis 72, within each magnetoresistor of the resistor bridge of the x-axis sensor unit 24 instead of each magnetoresistor only having magnetoresistive strips of one or the other subset of strips 76, 80 as in the embodiment of FIGS. 2 and 3. FIG. 8 depicts embodiments 24c, 28c of the x-axis and y-axis sensor units 24, 28 of the dual axis AMR sensor 20 that utilize an embodiment 76c, 80c of this alternative distribution of the first and second subsets of magnetoresistive strips 76, 80 of the x-axis sensor unit 24. In FIG. 8, as in the embodiment of FIGS. 2 and 3, the technological anisotropy axis 72 is shown as being in the horizontal direction, and the y-axis sensor unit 28 can include only magnetoresistive strips 36 having longitudinal axes 60 aligned in parallel with the technological anisotropy axis 72 (forming four magnetoresistors RY1c, RY2c, RY3c, RY4c). The x-axis sensor unit 24 can include the two subsets of magnetoresistive strips 76, 80, a first subset 76 having longitudinal axes 60 aligned at the first predetermined angle 84 to the technological anisotropy axis 72, and a second subset 80 having longitudinal axes 60 aligned at the second predetermined angle 88 to the technological anisotropy axis 72, having the same magnitude but the opposite rotational polarity from the technological anisotropy axis 72 as the predetermined angle 84 of the first subset 76.

However, unlike in FIGS. 2 and 3, each magnetoresistor of the resistor bridge of the x-axis sensor unit 24 can include magnetoresistive strips 36 from both the first and second subset of differently aligned strips 76, 80. In one embodiment, each magnetoresistor of the resistor bridge of the x-axis sensor unit 24 can include an equal number of magnetoresistive strips 36 from both the first and second subsets of differently aligned strips 76, 80. Specifically, in FIG. 8, a first magnetoresistor RX1c can include a series combination of a first strip from the first subset of strips 76, with a longitudinal axis oriented at the first angle 84 to the technological anisotropy axis 72, connected via interconnect to a second strip from the second subset of strips 80, with a longitudinal axis 60 oriented at the second angle 88 to the technological anisotropy axis 72, connected via interconnect to a third strip from the second subset of strips 80, and connected via interconnect to a fourth strip from the first subset of strips 76. The second, third and fourth magnetoresistors RX2c, RX3c, RX4c of the x-axis sensor unit 24 can also similarly include series combinations of alternating magnetoresistive strips 36 from the first and second subsets of strips 76, 80.

Figure 9:
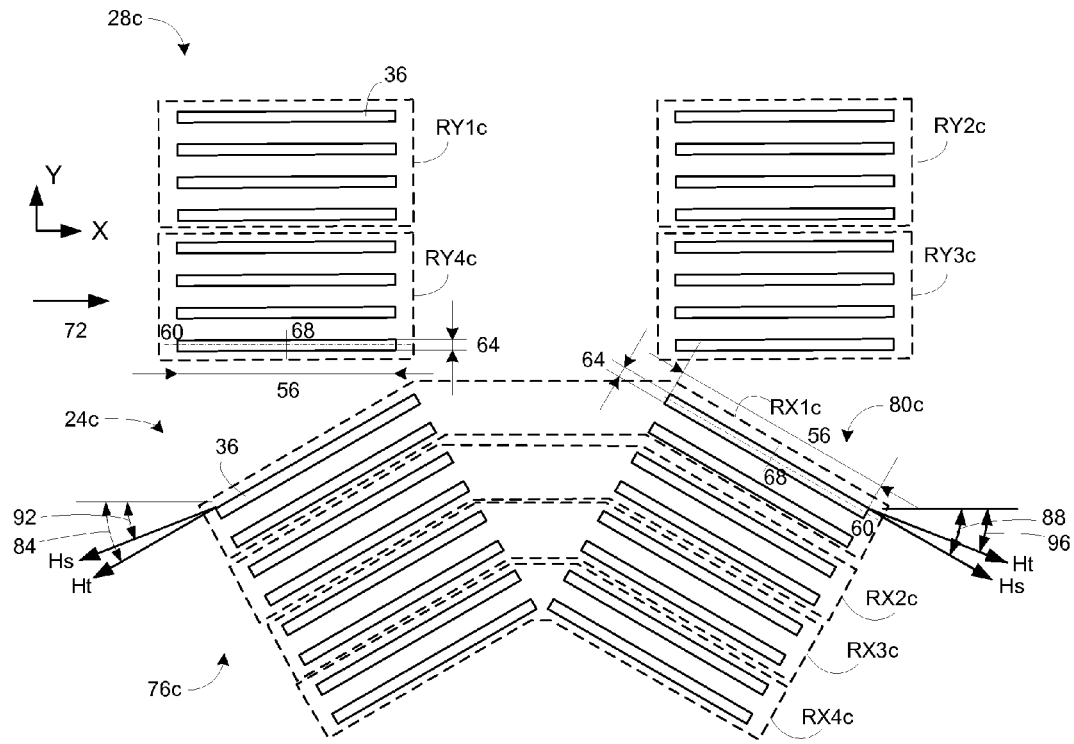
FIG. 9 is a top-view integrated-circuit layout diagram depicting the embodiment of the magnetoresistive layer depicted in FIG. 8.

FIG. 9 is a top view of just the layer of magnetoresistive material of the x- and y-axis sensor units 24c, 28c depicted in FIG. 8. As with other embodiments discussed above, the strips 36 of anisotropic magnetoresistive material can be substantially rectangular or substantially elongated strips from a top view, having a length 56 along a corresponding longitudinal axis 60 and a width 64 along a transverse axis 68 perpendicular to the longitudinal axis 60, the length 56 being greater in magnitude than the width 64; including one or more of square, rounded corner, or pointed ends; and can be formed using only a single layer, or single continuous set of layers, of magnetoresistive material, having only a single technological anisotropy axis.

The x-axis and y-axis sensor unit embodiments 24c, 28c of FIG. 8 can also each form a resistor bridge circuit that can receive power VP and ground inputs GND and provide differential output signals VX1, VX2, VY1, VY2 representing the sensed ambient magnetic field x- and y-axis components, respectively. The x-axis and y-axis sensor units 24c, 28c of FIG. 8 can also be represented by the equivalent circuit depicted in FIG. 4, with the first, second, third and fourth x-axis sensor unit magnetoresistor embodiments RX1c-RX4c of FIG. 8 represented by the first, second, third and fourth x-axis circuit resistors RX1-RX4 in FIG. 4, and the first, second, third and fourth y-axis sensor unit magnetoresistor embodiments RY1c-RY4c of FIG. 8 represented by the first, second, third and fourth y-axis circuit resistors RY1-RY4 in FIG. 4.

In operation, the embodiment 28c of the y-axis sensor unit 28 of FIGS. 8 and 9 can react to y-axis and x-axis ambient fields to produce a primary sensitivity to y-axis ambient field components in the form of a non-zero output signal VY1, VY2 in response to the y-axis field components and a reduced, or substantially zero, output signal VY1, VY2 in response to x-axis components in the same way as discussed above for the embodiment 28a of the y-axis sensor unit 28 of FIGS. 2 and 3, as the magnetoresistors of the y-axis sensor unit 28c in FIGS. 8 and 9 have the same relevant geometrical relationships and electrical interconnects as those of the embodiment 28a of FIGS. 2 and 3.

By contrast, in operation, the reaction of the embodiment 24c of the x-axis sensor unit 24 of FIGS. 8 and 9 to y-axis and x-axis ambient field components to produce a primary sensitivity to x-axis ambient field components, in the form of a non-zero output signal VX1, VX2 in response to the x-axis field components and a reduced, or substantially zero, output signal VX1, VX2 in response to y-axis components, can be modeled somewhat differently than as discussed above for the embodiment 24a of the x-axis sensor unit 24 of FIGS. 2 and 3, although which can be explained using similar vector field subtraction and addition principles. Specifically, because each magnetoresistor of the x-axis sensor unit 24c can include an equal number of magnetoresistor strips of the first and second subsets of strips 76, 80, each magnetoresistor has an first number of strips 36 that can respond to y-axis ambient components in a first manner, e.g., as depicted in FIGS. 6A-6E, and second, equal number of strips 36 that can respond to y-axis ambient components in a second manner, e.g., as depicted in FIGS. 7A-7E, thereby cancelling out the effect of y-axis ambient field components on the overall resistance of each magnetoresistor of the x-axis sensor unit 24c and producing substantially reduced or zero sensitivity and output signal and response to y-axis ambient field components. However, the alignment of the longitudinal axis 60 and barber poles 100 of each strip 36 of each magnetoresistor of the x-axis sensor unit 24c can cause the effect of x-axis ambient field components to add, and produce a primary sensitivity and a non-zero output signal VX1, VX2 and response to x-axis ambient field components.

As discussed above in the context of FIG. 2, the differing orientations of the barber pole strips 100 for magnetoresistors within the x-axis and y-axis sensor units 24c, 28c in FIG. 8 can again be configured to correspond with the corresponding magnetoresistors position and operation within the resistor bridges of these sensor units 24c, 28c. The y-axis sensor unit 28c can include barber pole strips 100 having longitudinal axes 104 oriented in two different directions relative to the longitudinal axes 60 of the corresponding magnetoresistive strips 36. A first set of magnetoresistors can have barber pole strips 100 oriented at a first angle to the longitudinal axes 60 of the corresponding magnetoresistive strips 36, and a second set of magnetoresistors can have barber pole strips 100 oriented at a second angle to the longitudinal axes 60 of the corresponding magnetoresistive strips 36. In FIG. 8, the first set of magnetoresistors can include the first and second magnetoresistors RY1c, RY2c, and the second set of magnetoresistors can include the third and fourth resistors RY3c, RY4c. The first and second subsets of magnetoresistive strips 76c, 80c of the x-axis sensor unit 24 can also each include barber pole strips 100 having longitudinal axes 104 oriented in two different directions relative to the longitudinal axes 60 of the corresponding magnetoresistive strips 36. However, in FIG. 8, in contrast to FIG. 2, each magnetoresistor can have barber pole strips 100 from each of these subsets 76, 80c, and thus each magnetoresistor can include barber pole strips 100 oriented at a first angle to the longitudinal axes 60 of the corresponding magnetoresistive strips 36 of the first subset 76c and barber pole strips 100 oriented at a second angle to the longitudinal axes 60 of the corresponding magnetoresistive strips 36 of the second subset 80c.

Note that, as discussed further below, the quiescent directions of the magnetization of the magnetoresistors corresponding to the left half of the x-axis and y-axis sensor units 28c, 24c in FIG. 8 (i.e., the first and fourth magnetoresistors RY1c, RY4c of the y-axis sensor unit 28c and the first subset of magnetoresistive strips 76c of the magnetoresistors RX1c-RX4c of the x-axis sensor unit 24c) can be set in opposing directions in comparison to those magnetoresistors corresponding to the right half of the x-axis and y-axis sensor units in this embodiment (i.e., the second and third magnetoresistors RY2c, RY3c of the y-axis sensor unit 28c and the second subset of magnetoresistive strips 80c of the magnetoresistors RX1c-RX4c of the x-axis sensor unit 24c).

Figures 10, 11:
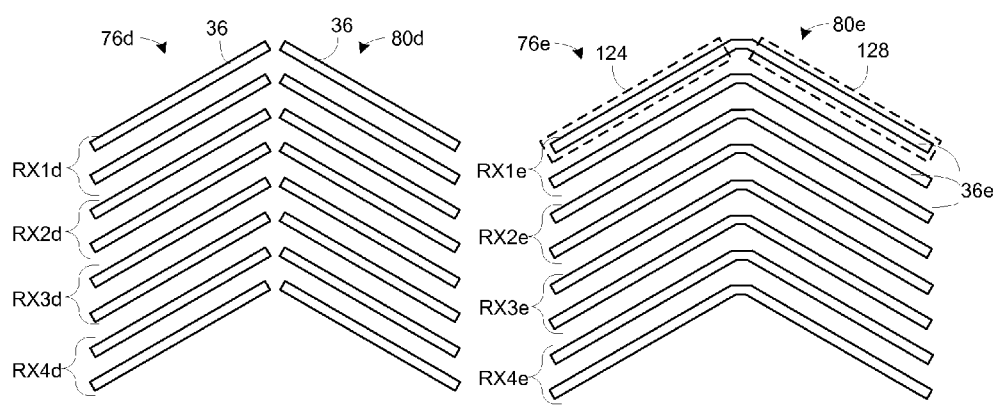
FIG. 10 is a top-view integrated-circuit layout diagram depicting an embodiment of a magnetoresistive layer for embodiments of the x-axis sensor unit similar to that depicted in FIG. 8.
FIG. 11 is a top-view integrated-circuit layout diagram depicting another embodiment of a magnetoresistive layer for embodiments of the x-axis sensor unit similar to that depicted in FIG. 8.

The shape and relative layout of the distribution of both first and second subsets of magnetoresistive strips 76c, 80c to each magnetoresistor of the alternative embodiment of the x-axis sensor unit 24c depicted in FIGS. 8 and 9 can be varied yet still produce the operation of the x-axis sensor unit 24 whereby the effect of y-axis ambient field components are canceled but the effect of x-axis ambient field components add to produce a primary sensitivity and output signal VX1, VX2 as a function of the x-axis ambient field components. FIG. 10 depicts another embodiment of the layout of magnetoresistive material to form the first and second subsets of magnetoresistive strips 76d, 80d of the magnetoresistors RX1d-RX4d, in which the relative positioning of each of the strips 36 is brought closer to the others along an x-axis direction, to produce a smaller overall integrated circuit footprint and therefore reduced cost.

Figure 12:
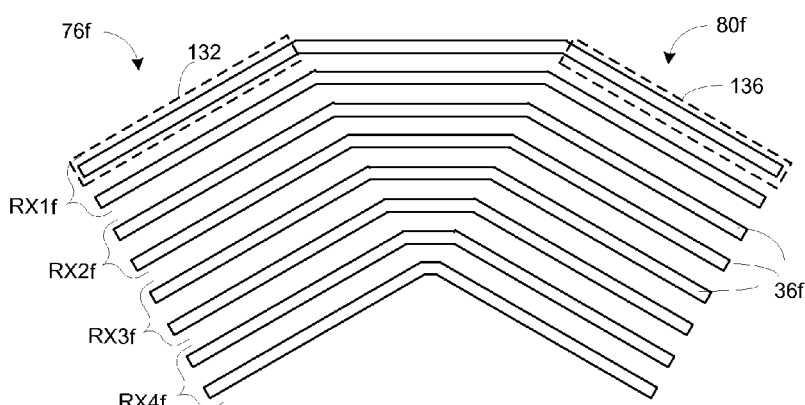
FIG. 12 is a top-view integrated-circuit layout diagram depicting another embodiment of a magnetoresistive layer for embodiments of the x-axis sensor unit similar to that depicted in FIG. 8.

The first and second subsets of magnetoresistive strips 76, 80 can also be formed from continuous merged sections of magnetoresistive material, yet again still retain the same characteristic operation of the x-axis sensor unit to produce a primary sensitivity and output signal as a function of the x-axis ambient field components. FIG. 11 depicts an embodiment of the layout of the magnetoresistive material to form a plurality of merged magnetoresistive strips 36e, each merged strip having a strip portion 124 representing a strip from the first subset of strips 76e and a strip portion 128 representing a strip from the second subset of strips 80e. FIG. 12 depicts another embodiment of the layout of the magnetoresistive material to form a plurality of merged magnetoresistive strips 36f, each merged strip 36f having a strip portion 132 representing a strip from the first subset of strips 76f and a strip portion 136 representing a strip from the second subset of strips 80f. In both FIGS. 11 and 12, the magnetoresistors RX1e-RX4e, RX1f-RX4f can include conductive layers formed on top of the portions of the merged magnetoresistive strips connecting the portions 124, 128, 132, 136 representing the strips from the first and second subsets of strips 76, 80.

The resistor bridges of the x-axis and y-axis sensor units 24, 28 can include different numbers of resistors in different embodiments. For example, the x-axis sensor unit 24 can include the two subsets of magnetoresistive strips 76, 80 organized as an eight-resistor bridge instead of a four-resistor bridge. FIGS. 13 and 14 depict embodiments of the magnetoresistive material of embodiments of the x-axis sensor unit 24 configured to form an eight resistor circuit bridge. In FIG. 13, a first, second, third and four magnetoresistors RX1g-Rx4g can be formed from the first subset of magnetoresistive strips 76g, spatially grouped together, having the first orientation to the technological anisotropy axis 72, and fifth, sixth, seventh and eight magnetoresistors RX5g-RX8g can be formed from the second subset of magnetoresistive strips 80g, also spatially grouped together, having the second orientation to the technological anisotropy axis 72. In FIG. 14, first, second, third and four magnetoresistors RX1h-RX4h can again be formed from the first subset of magnetoresistive strips 76h having the first orientation to the technological anisotropy axis 72, although in this embodiment the first and second magnetoresistors RX1h, RX2h can be spatially grouped separately from the third and fourth magnetoresistors RX3h, RX4h. Similarly, fifth, sixth, seventh and eight magnetoresistors RX5h-RX8h can again be formed from the second subset of magnetoresistors 80h having the second orientation to the technological anisotropy axis 72, with the fifth and sixth magnetoresistors RX5h, RX6h spatially grouped separately from the seventh and eight magnetoresistors RX7h, RX8h.

Conductive interconnect can be formed on top of or below the embodiments of magnetoresistive material depicted in FIGS. 13 and 14 to form the eight-resistor bridge of the y-axis sensor unit by forming conductive interconnect between the magnetoresistive strips 36 of the various single magnetoresistors to form a series connection of the constituent magnetoresistive strips 36, conductive interconnect between the various individual magnetoresistors to form the resistor bridges, and conductive layer portions to form barber poles 100. FIG. 15 depicts a schematic circuit diagram showing an equivalent circuit that can be formed by conductively interconnecting the magnetoresistive layer layout embodiments of FIGS. 13 and 14. In FIG. 15, the magnetoresistors RX1g-RX8g, RX1h-RX8h of FIGS. 13 and 14 layout embodiments can be represented by corresponding circuit resistors RX1i-RX8i. The eight resistor circuit bridge of FIGS. 13-15 can operate essentially according to the principles already discussed above, with individual strips 36 from the first and second subsets of magnetoresistive strips 76, 80 having sensitivity to both x-axis and y-axis ambient field components, but the different orientations of the first and second subsets of strips 76, 80 and their configuration into the resistor bridge resulting in y-axis effects cancelling each other and x-axis effects adding together, yielding a primary sensitivity of the x-axis sensor unit 24 to x-axis ambient field components and a reduced or substantially zero sensitivity to y-axis ambient field components.

Figure 16:
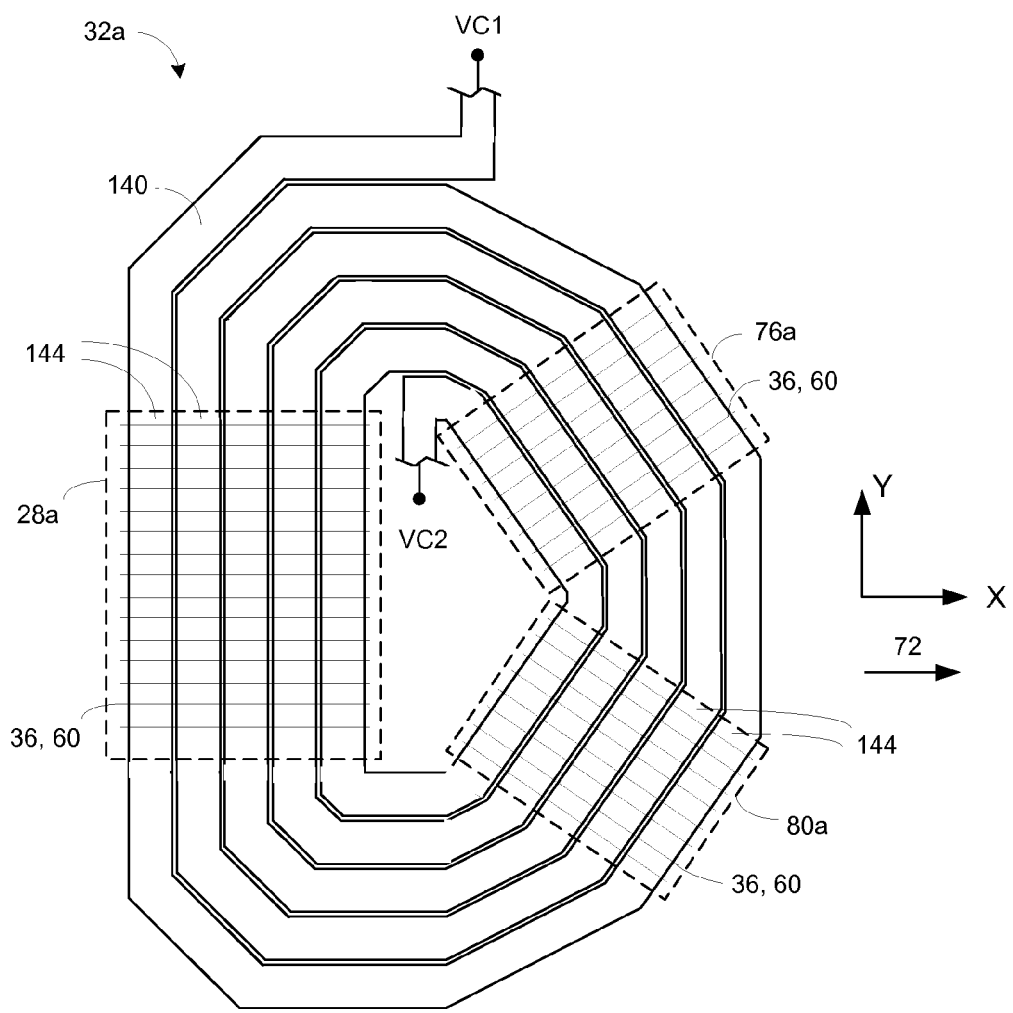
FIG. 16 is a top-view integrated-circuit layout diagram depicting an embodiment of a conductive coil of the dual-axis AMR sensor.

The dual-axis AMR sensor 20 can include a conductive coil 32, also referred to as a "flipping coil" 32 to induce selected magnetic fields into and about the magnetoresistors of the x-axis and y-axis sensor units 24, 28. FIG. 16 depicts an exemplary embodiment of the conductive coil 32a, shaped for use with embodiments having layouts similar to those depicted in FIGS. 2 and 3. The conductive coil 32 can include a continuous path of conductive material 140 electrically connected between a first coil terminal and a second coil terminal, and travelling spatially in a repeating loop such that a plurality of straight conductor sections 144 are formed either over or under the magnetoresistive strips 36 and associated barber poles 100 and other conductive interconnect of the x-axis and y-axis sensor units 24, 28. In FIG. 16, for clarity and simplicity of illustration, the y-axis sensor unit 28a and the magnetoresistive strip subsets 76a, 80a of the x-axis sensor unit 24 are shown with dashed lines in simplified schematic form that roughly shows the x-axis and y-axis sensor unit perimeters and the magnetoresistive strip longitudinal axes 60 in comparison to the spatial layout of the flipping coil 32a. As depicted in FIG. 6, the plurality of straight conductor sections 144 formed over or under the magnetoresistive strips can be formed so that current flowing through these sections travels in a direction perpendicular to the longitudinal axes 60 of the magnetoresistive strips 36. This can be accomplished by the plurality of straight conductor sections 144 themselves having longitudinal axes perpendicular to the longitudinal axes 60 of the magnetoresistive strips 36. The flipping coil 32 can be formed from one or more layers of conductive material.

In operation, first and second control signals VC1, VC2 can be selectively delivered to the terminals of the conductive coil 32 to cause a current to flow through the coil 32. As a result of the magnetic properties of current flowing through a conductor, the plurality of conductor sections 144 over or under the magnetoresistive strips 36 can create a corresponding magnetic field in the spatial region coinciding with and about the magnetoresistive strips 36 as a function of the selectively controlled current. This magnetic field can be produced for a variety of purposes. It can be the nature of the technological, shape and resulting total anisotropy fields Hk, Hs, Ht of the magnetoresistors to take the form of either one of two different opposite vector directions parallel to the respective anisotropy axes. In the quiescent state, the magnetization M of the individual strips 36 can align itself in the same direction as the direction of the total anisotropy field Ht of the respective strip 36. The first and second control signals VC1, VC2 can be selected to produce a magnetic field from the flipping coil 32 to set or reset, i.e., "flip," between the two different opposite vector directions of these technological, shape and resulting total anisotropy field vectors Hk, Hs, Ht. The first and second control signals VC1, VC2 can also be selected to produce a magnetic field from the conductive coil 32 to modulate or otherwise modify or combine with the ambient magnetic field sensed by the AMR sensor 20, to, for example, produce output signals having modulated or modified forms.

Figure 17:
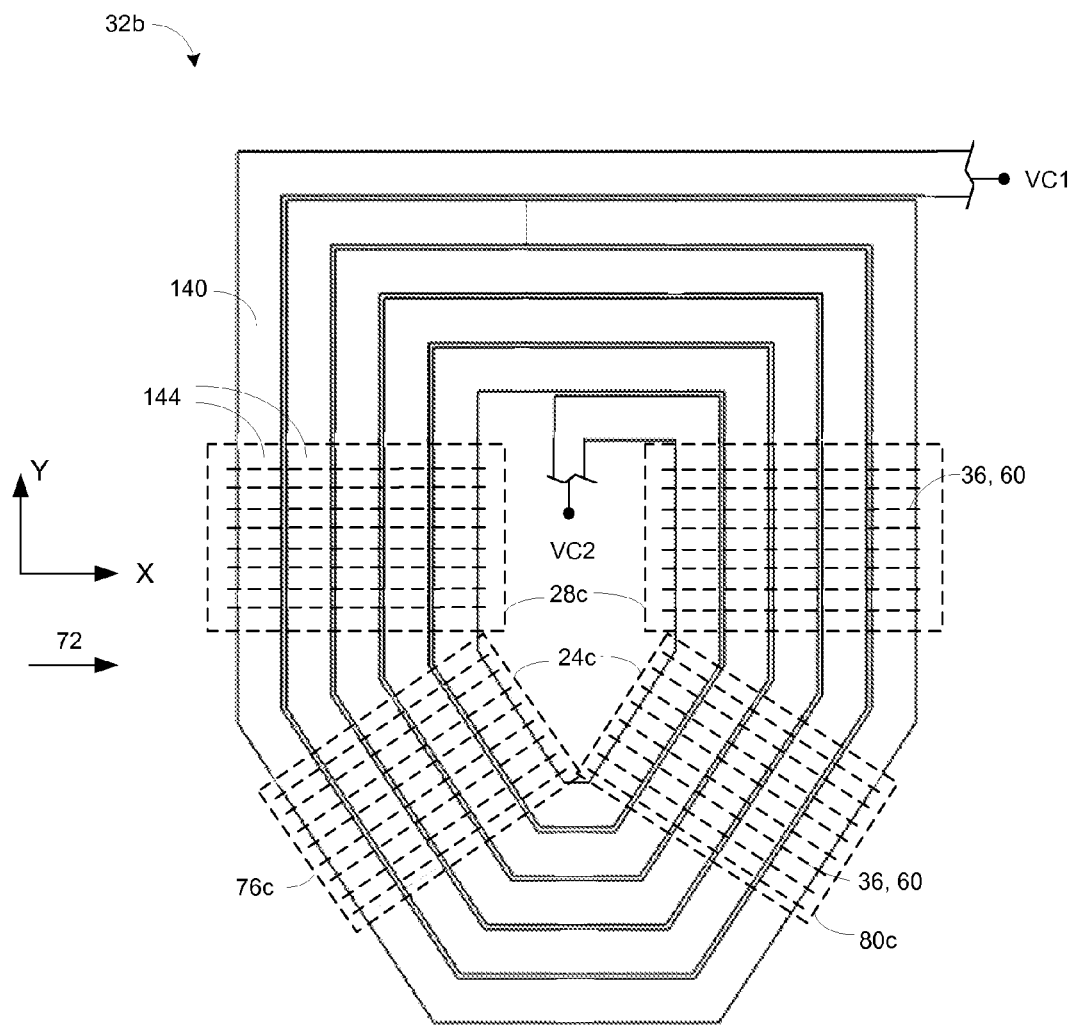
FIG. 17 is a top-view integrated-circuit layout diagram depicting another embodiment of the conductive coil of the dual-axis AMR sensor.

The conductive coil 32 can take on various shapes to correspond with the various embodiments of the magnetoresistive strip layouts discussed herein. FIG. 17 depicts an embodiment of the conductive coil 32b shaped for use with embodiments having magnetoresistor layouts similar to those depicted in FIGS. 8-12. Again for clarity and simplicity of illustration, the embodiments of the x-axis and y-axis sensor units 24c, 28c and their corresponding magnetoresistive strips 36 are shown with dashed lines in simplified schematic form that roughly shows the x-axis and y-axis sensor unit perimeter and the magnetoresistive strip longitudinal axes 60 in comparison to the spatial layout of the flipping coil 32b. Note that the coil current flow produced by the embodiment of FIG. 17 can be used to set the quiescent direction of the magnetization in opposing directions for those magnetoresistors corresponding to the left half of the coil in comparison to those corresponding to the right half of the coil in the embodiment depicted in FIG. 8. That is, in one embodiment the flipping coil 32b of FIG. 17 can set the quiescent direction of the magnetization in the FIG. 8 embodiment along the negative x-axis for the first and fourth magnetoresistors RY1c, RY4c of the y-axis sensor unit 28c, roughly to the left along the longitudinal x-axis 60 of the first subset of magnetoresistive strips 76c (or near to this axis, given the variation between the shape and total anisotropy axes discussed above) for the magnetoresistors RX1c-RX4c of the x-axis sensor unit 24c, along the positive x-axis for the second and third magnetoresistors RY2c, RY3c of the y-axis sensor unit 28c, and roughly to the right along the longitudinal x-axis 60 of the second subset of magnetoresistive strips 80c (or near to this axis, given the variation between the shape and total anisotropy axes discussed above) for the magnetoresistors RX1c-RX4c of the x-axis sensor unit 24c. In other embodiments, these quiescent directions can also all be reversed.

Figure 18:
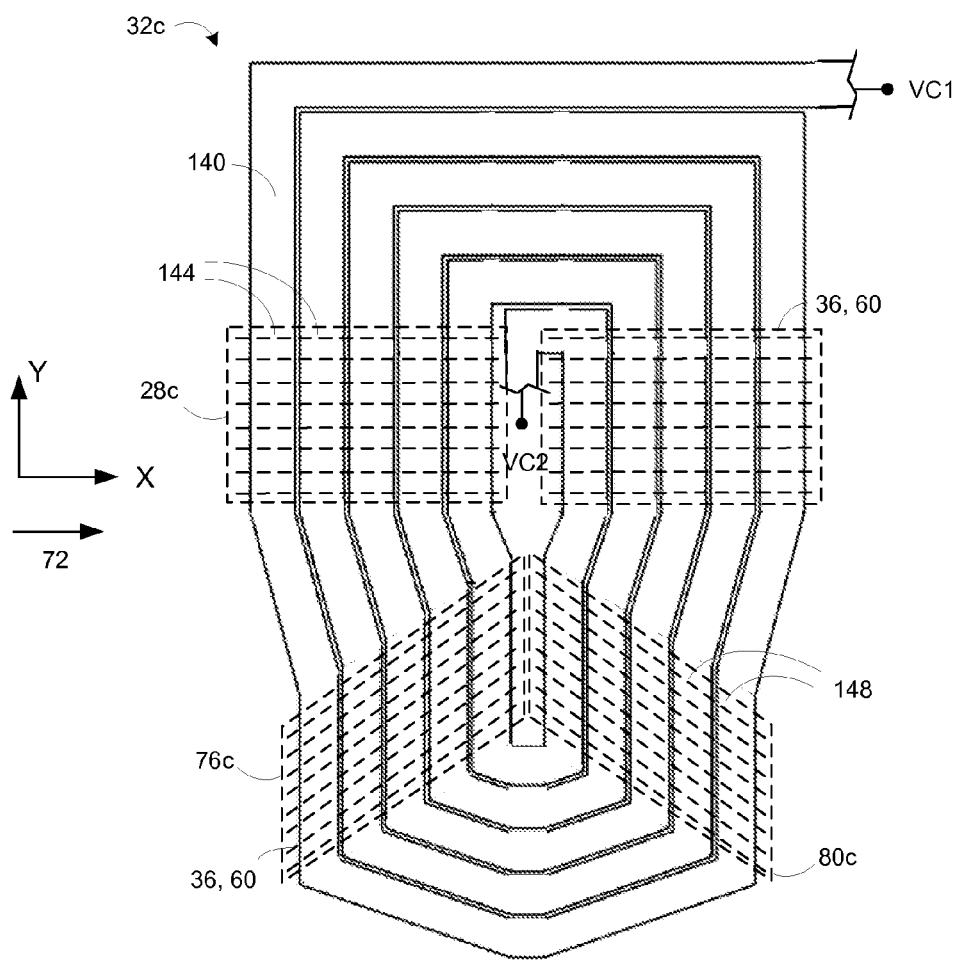
FIG. 18 is a top-view integrated-circuit layout diagram depicting another embodiment of the conductive coil of the dual-axis AMR sensor.

The shape of the conductive coil 32 can also be configured to have a reduced layout area, and thus a reduced resultant dual-axis AMR integrated circuit chip area and cost. FIG. 18 depicts an embodiment of the conductive coil 32c again shaped for use with embodiments having magnetoresistor layouts similar to those depicted in FIGS. 8-12, in which the coil layout area is reduced by providing the plurality of straight conductor sections 148 under the magnetoresistive strips 36 of the x-axis sensor unit 24c so that the current conducted by these sections 148, and their associated longitudinal axis, is oriented at less than 90°, or less than perpendicular, to the longitudinal axes 60 of the x-axis sensor unit magnetoresistive strips 36. Although the "flipping" effectiveness of these coil sections 148 may be reduced in comparison to perpendicularly aligned coil sections 144, this may be an acceptable tradeoff for the chip area and cost savings of the reduced coil layout area.

Figure 19:
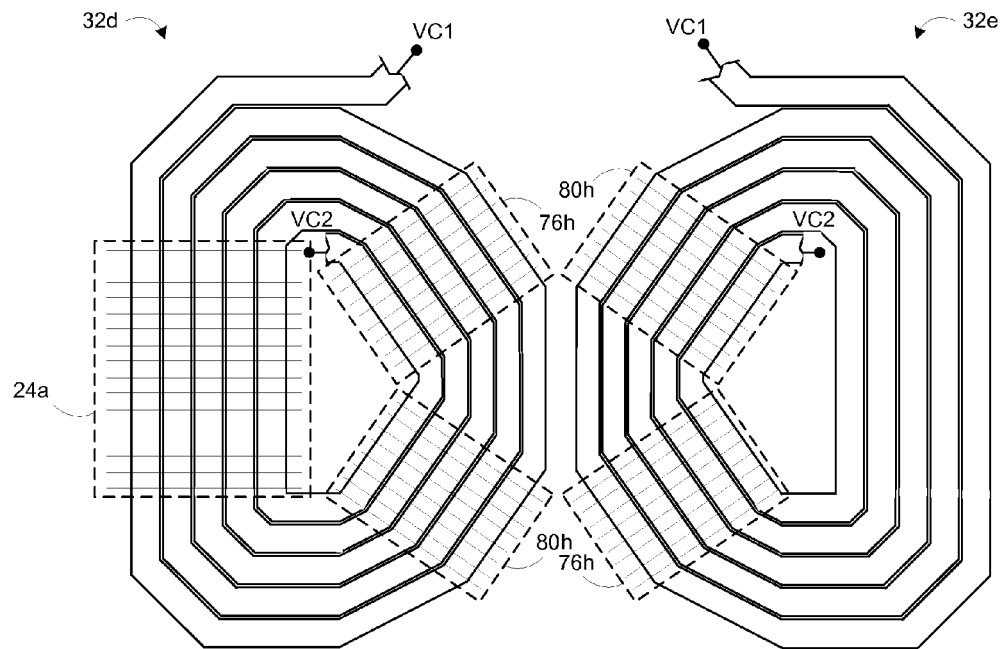
FIG. 19 is a top-view integrated-circuit layout diagram depicting an embodiment of dual conductive coils of embodiments of the dual-axis AMR sensor.
Figure 20:
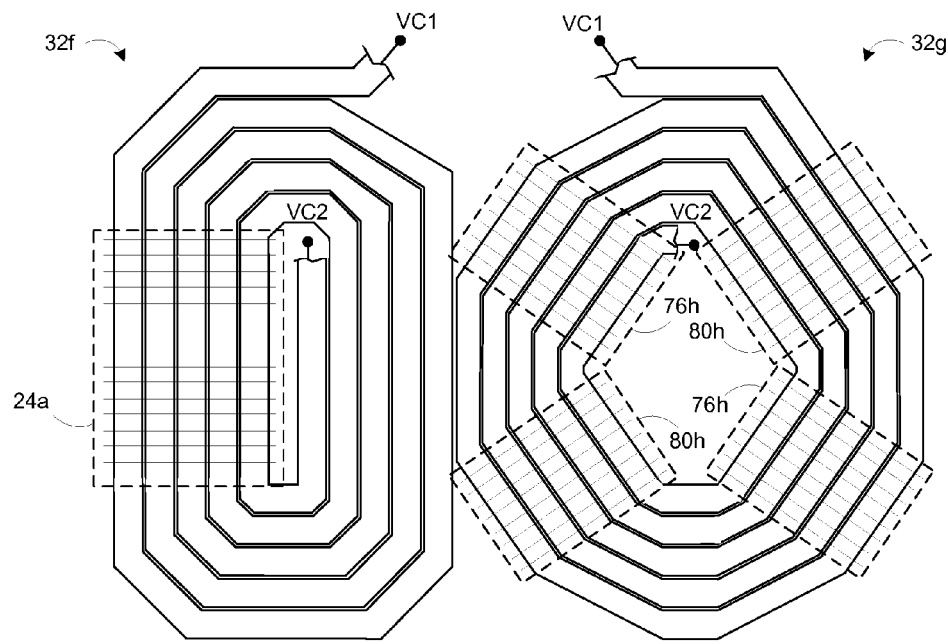
FIG. 20 is a top-view integrated-circuit layout diagram depicting another embodiment of dual conductive coils of embodiments of the dual-axis AMR sensor.

The dual-axis AMR sensor 20 can also include a plurality of the conductive coils 32. The plurality of coils 32 can be either independently controlled by different sets of control signals, or placed electrically in parallel or in series and controlled with a single set of control signals. FIGS. 19-20 depict embodiments of a set of two conductive coils 32d-e, 32f-g for use in embodiments of the AMR sensor 20, the coil sets shaped for use with embodiments having y-axis sensor unit magnetoresistor layouts similar to those depicted in FIGS. 2-3, and x-axis sensor unit magnetoresistor layouts similar to that depicted in FIG. 14. The plurality of conductive coils 32 of embodiments of the AMR sensor 20 can include either a single coil 32 for producing magnetic fields only for the x-axis sensor unit 24 and a single coil 32 for producing magnetic fields only for the y-axis sensor unit 28, as is depicted in FIG. 20, or they can include one or more coils 32 that produce magnetic fields for both the x-axis and y-axis sensor units 24, 28 or portions thereof, as is depicted in FIG. 19.

The dual axis AMR sensor 20 can also include a compensation coil. The compensation coil can be used to generate compensation magnetic fields in the area of the strips 36 that can compensate for the measured ambient field to create a state in which the strips will effectively experience a substantially zero magnetic field. The amount of current to be fed into this compensation coil, and thus the magnitude and polarity of the compensation field produced by such, can be controlled by a negative feedback system including an amplifier. An input for such a feedback system can be the bridge output voltages VX1, VX2, VY1, VY2. An output of a system including such an embodiment of the dual axis AMR sensor 20 can be the current fed into the compensation coil. The compensation coil can be formed in the same fashion as the flipping coil 32, but may be formed in a different conductive layer. Thus, the dual axis AMR sensor 20 may include at least one flipping coil 32 (according to any of the above embodiments), as well as at least one compensation coil (also formed according to any of the above embodiments of the flipping coil). In embodiments having both a flipping coil 32 and a compensation coil, the compensation coil can be implemented to produce a compensation field perpendicular to the longitudinal axes 60 of the strips 36 and thus also perpendicular to the flipping coil field. Therefore, the current lines of the compensation coil, resulting from the geometry and orientation of the compensation coil, can be perpendicular to the current lines of the flipping coil 32.

Figure 21:
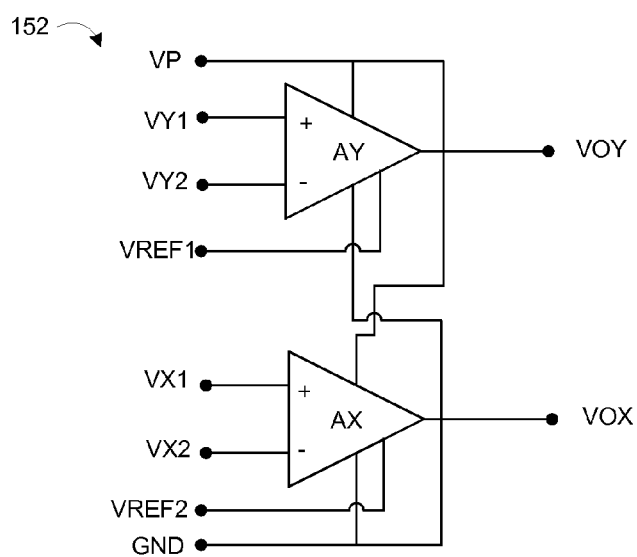
FIG. 21 is a circuit schematic depicting an embodiment of an output-processing circuit that can be included in or used with the dual-axis AMR sensor.

The dual-axis AMR sensor 20 can also include, or be used with, an output processing circuit to further process the differential output voltages VX1, VX2, VY1, VY2 to yield adjusted output voltages. The output processing circuit can include one or more differential amplifiers to receive the differential output voltages VX1, VX2, VY1, VY2 from the x-axis and y-axis sensor units 24, 28 and produce single ended, amplified output signals biased around reference voltages. FIG. 21 is a schematic circuit diagram depicting an exemplary embodiment of the output processing circuit 152. In FIG. 21, the output processing circuit 152 can include a first amplifier AY to receive the differential y-axis output VY1, VY2 and a first reference voltage VREF1, and produce a single-ended output signal VOY having a value, referenced to ground, equal to the magnitude of the differential output VY1, VY2 amplified by a predetermined amplification factor A1 and added to the first reference voltage VREF1, or VOY=A1(VY1−VY2)+VREF1. Similarly, the output processing circuit 152 can also include a second amplifier AX to receive the differential x-axis output VX1, VX2 and a second reference voltage VREF2, and produce a single-ended output signal VOX having a value, referenced to ground, equal to the magnitude of the differential output VX1, VX2 amplified by a predetermined amplification factor A2 and added to the second reference voltage VREF2, or VOX=A2(VX1−VX2)+VREF2. Other embodiments of the output processing circuit 152 are also possible, such as embodiments that produce single-ended or differential output signals as various functions of the differential sensor unit outputs and received reference voltages, such as functions including mathematical manipulations of the differential sensor unit outputs and reference voltages such as addition, multiplication, integration, etc. The output processing circuit 152 can be included as part of the same integrated circuit, i.e., on the same integrated circuit substrate, as the dual-axis AMR sensor 20, or as part of a separate, different integrated or other circuit electrically connected to the dual-axis AMR sensor 20.

Other embodiments of the dual-axis AMR sensor 20 are also possible. In embodiments, the polarity of the differential output signals VX1, VX2, VY1, VY2, and the correspondence of this polarity to the polarity of sensed ambient magnetic field components, can be reversed or changed by changing circuit interconnections of the resistor bridges of the x-axis and y-axis sensor units 24, 28, assignment of certain conductive leads to certain output terminals, assignment of barber pole strip angles 108, 112, 116, 120 to certain magnetoresistors, etc. Labeling herein of certain elements, such as magnetoresistors or circuit resistors, as "first," "second," "third," etc., is arbitrary and for ease of discussion only, and other assignment of numerical or other labels to these elements is possible. Although embodiments of magnetoresistors discussed herein advantageously have various pluralities of magnetoresistive strips 36 connected in series, other embodiments of magnetoresistors used in the x-axis and y-axis sensor units 24, 28 can generally include one or more magnetoresistive strips 36, connected in series when a plurality. Although the x-axis and y-axis sensor units 24, 28 are discussed herein as receiving a power supply voltage VP and ground GND to power their resistor bridges, the x-axis and y-axis sensor units 24, 28 can receive other voltages to power these resistor bridges, such as positive and negative predetermined or selected voltages (e.g., positive and negative power supply voltages), a positive predetermined or selected voltage (e.g., a positive power supply voltage) and ground, or ground and a negative predetermined or selected voltage (e.g., a negative power supply voltage). Also, although embodiments of the x-axis and y-axis sensor units 24, 28 discussed herein produce differential output signals VX1, VX2, VY1, VY2 in other embodiments the x-axis and y-axis sensor units 24, 28 can produce single-ended output signals. Additionally, although certain integrated-circuit layout embodiments are discussed herein and shown in the appended drawings, other integrated-circuit layouts can be used to implement the dual axis AMR sensor 20, including the various embodiments discussed herein, by using different layer material shapes, routing paths, etc.

Furthermore, any feature of any of the embodiments of the dual-axis AMR sensor 20 can optionally be used in any other embodiment of the dual-axis AMR sensor 20. Also, embodiments of the dual-axis AMR sensor 20 can optionally include any subset of the components or features of any embodiments of the dual-axis AMR sensor 20 described herein.

What is claimed is:

1. A sensor, comprising:
   a first sensor unit, on an integrated circuit substrate, having a resistor bridge including a plurality of magnetoresistors, each magnetoresistor having at least one elongated strip of anisotropic magnetoresistive material having a longitudinal axis substantially parallel to a technological anisotropy axis of the magnetoresistive material;
   a second sensor unit, on the integrated circuit substrate, having a resistor bridge including a plurality of magnetoresistors having a plurality of elongated strips of the anisotropic magnetoresistive material, wherein the plurality of strips of the second sensor unit include:
   a first subset of strips having longitudinal axes aligned at a first angle to the technological anisotropy axis, and
   a second subset of strips having longitudinal axes aligned at a second angle to the technological anisotropy axis, wherein the second angle has substantially the same magnitude but opposite polarity as the first angle; and
   at least one conductive coil configured to selectively generate a plurality of different magnetic fields in the plurality of magnetoresistors of the second sensor unit to selectively set a magnetization of the plurality of magnetoresistors of the second sensor unit to different directions.

2. The sensor of claim 1, wherein the anisotropic magnetoresistive material has a common technological anisotropy axis.

3. The sensor of claim 1, wherein each of the plurality of magnetoresistors of the second sensor unit includes at least one magnetoresistive strip from the first subset and at least one magnetoresistive strip from the second subset.

4. The sensor of claim 1, wherein each magnetoresistor of the second sensor unit includes magnetoresistive strips from only the first subset or only the second subset.

5. The sensor of claim 1, wherein the anisotropic magnetoresistive material of the first and second sensor units is provided in a common layer of the anisotropic magnetoresistive material.

6. The sensor of claim 1, wherein the anisotropic magnetoresistive material of the first and second sensor units is provided in a common vertically continuous set of layers of one or more anisotropic magnetoresistive materials.

7. The sensor of claim 1, wherein the first sensor unit is configured to be sensitive to and output a first differential voltage representing a y-axis ambient magnetic field component.

8. The sensor of claim 1, wherein the second sensor unit is configured to be sensitive to and output a second differential voltage representing a x-axis ambient magnetic field component.

9. The sensor of claim 1, further comprising barber-pole conductive strips formed on top of or below each of the magnetoresistive strips of each of the magnetoresistors of the first and second sensor units.

10. The sensor of claim 9, wherein the barber-pole conductive strips include strips having at least two different spatial orientations to the longitudinal axes of corresponding magnetoresistive strips.

11. The sensor of claim 9, wherein the plurality of barber-pole conductive strips have longitudinal axes aligned at a third angle to the longitudinal axis of the respective magnetoresistive strips, the third angle is between 40° and 55°.

12. The sensor of claim 1, wherein the resistor bridges of the first and second sensor units are four-resistor bridges.

13. The sensor of claim 1, wherein the resistor bridge of the second sensor unit is an eight-resistor bridge.

14. The sensor of claim 1, wherein the magnitude of the first and second angles is between 30° and 40°.

15. The sensor of claim 1, wherein each magnetoresistive strip of the first and second sensor units is a substantially rectangular or elongated portion having a length aligned to its longitudinal axis and a width, having a magnitude less than that of the length, perpendicular to the longitudinal axis.

16. The sensor of claim 1, wherein the conductive coil is arranged in at least one of the following configurations: in a layer above the magnetoresistive material of the first and second sensor units, or in a layer below the magnetoresistive material of the first and second sensor units.

17. The sensor of claim 16, wherein the conductive coil includes a plurality of substantially straight conductor portions configured to conduct current substantially perpendicular to the longitudinal axes magnetoresistive strips thereunder or thereover.

18. The sensor of claim 16, wherein the conductive coil includes a plurality of substantially straight conductor portions configured to conduct current at an angle not perpendicular to the longitudinal axes magnetoresistive strips thereunder or thereover.

19. The sensor of claim 1, wherein the anisotropic magnetoresistive material includes nickel-iron (NiFe).

20. The sensor of claim 1, further comprising at least one second conductive coil configured to selectively generate a plurality of different magnetic fields in the plurality of magnetoresistors of the first sensor unit.

21. The sensor of claim 1, wherein the at least one conductive coil includes a plurality of conductive coils configured to selectively generate the plurality of different magnetic fields in the plurality of magnetoresistors of the second sensor unit.

22. The sensor of claim 1, wherein the resistor bridge of the second sensor unit includes first and second magnetoresistors connected to a first output terminal, the first and second magnetoresistors including magnetoresistive strips from only the first subset of strips.

23. The sensor of claim 22, wherein the resistor bridge of the second sensor unit includes third and fourth magnetoresistors connected to a second output terminal, the third and fourth magnetoresistors including magnetoresistive strips from only the second subset of strips.

24. A sensor, comprising:
a first sensor unit having a resistor bridge including a plurality of magnetoresistors, each magnetoresistor having at least one elongated strip of anisotropic magnetoresistive material having a longitudinal axis substantially parallel to a technological anisotropy axis of the magnetoresistive material; and
a second sensor unit having a resistor bridge including a plurality of magnetoresistors having a plurality of elongated strips of the anisotropic magnetoresistive material, wherein the plurality of magnetoresistors each include a strip from both a first and second subset of strips, wherein
the first subset of strips have longitudinal axes aligned at a first angle to the technological anisotropy axis, and
the second subset of strips have longitudinal axes aligned at a second angle to the technological anisotropy axis, wherein the second angle has substantially the same magnitude but opposite polarity as the first angle.

25. The sensor of claim 24, wherein the anisotropic magnetoresistive material has a common technological anisotropy axis.

26. The sensor of claim 24, wherein the first and second sensor units are formed on a common integrated circuit substrate.

27. The sensor of claim 24, further comprising barber-pole conductive strips formed on top of each of the magnetoresistive strips of each of the magnetoresistors of the first and second sensor units.

28. The sensor of claim 24, wherein the magnitude of the first and second angles is between 30° and 40°.

29. The sensor of claim 24, further comprising a conductive coil arranged in at least one of the following configurations: in a layer above the magnetoresistive material of the first and second sensor units, or in a layer below the magnetoresistive material of the first and second sensor units.

30. A sensor, comprising:
a first sensor unit, on an integrated circuit substrate, having a resistor bridge including a plurality of magnetoresistors, each magnetoresistor having at least one elongated strip of anisotropic magnetoresistive material having a longitudinal axis substantially parallel to a technological anisotropy axis of the magnetoresistive material;
a second sensor unit, on the integrated circuit substrate, having a resistor bridge including a plurality of magnetoresistors having a plurality of elongated strips of the anisotropic magnetoresistive material, wherein the plurality of magnetoresistors include:
a first subset of magnetoresistors having strips with longitudinal axes aligned at a first angle to the technological anisotropy axis, and
a second subset of magnetoresistors having strips with longitudinal axes aligned at a second angle to the technological anisotropy axis, wherein the second angle has substantially the same magnitude but opposite polarity as the first angle; and
at least one conductive coil configured to selectively generate a plurality of different magnetic fields in the plurality of magnetoresistors of the second sensor unit to selectively set a magnetization of the plurality of magnetoresistors of the second sensor unit to different directions.

31. The sensor of claim 30, wherein the anisotropic magnetoresistive material has a common technological anisotropy axis.

32. The sensor of claim 30, further comprising barber-pole conductive strips formed on top of or below each of the magnetoresistive strips of each of the magnetoresistors of the first and second sensor units.

33. The sensor of claim 30, wherein the magnitude of the first and second angles is between 30° and 40°.

34. The sensor of claim 30, wherein the conductive coil is arranged in at least one of the following configurations: in a layer above the magnetoresistive material of the first and second sensor units, or in a layer below the magnetoresistive material of the first and second sensor units.

* * * * *